(12) United States Patent
Yudasaka et al.

(10) Patent No.: US 7,348,224 B2
(45) Date of Patent: Mar. 25, 2008

(54) METHOD FOR MANUFACTURING THIN FILM TRANSISTOR, ELECTRO-OPTICAL DEVICE AND ELECTRONIC APPARATUS

(75) Inventors: Ichio Yudasaka, Chino (JP); Takashi Masuda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 258 days.

(21) Appl. No.: 11/175,347

(22) Filed: Jul. 7, 2005

(65) Prior Publication Data

US 2006/0008956 A1   Jan. 12, 2006

(30) Foreign Application Priority Data

| | | |
|---|---|---|
| Jul. 9, 2004 | (JP) | ............................ 2004-203385 |
| Jul. 9, 2004 | (JP) | ............................ 2004-203393 |
| Jul. 9, 2004 | (JP) | ............................ 2004-203395 |
| Mar. 1, 2005 | (JP) | ............................ 2005-055983 |

(51) Int. Cl.
*H01L 21/00* (2006.01)
*H01L 27/01* (2006.01)

(52) U.S. Cl. ........................ 438/151; 438/154; 438/164; 257/350

(58) Field of Classification Search ................ 438/149, 438/151, 152, 153, 154, 164; 257/350, 351, 257/347
See application file for complete search history.

(56) References Cited

U.S. PATENT DOCUMENTS

| | | | |
|---|---|---|---|
| 6,479,331 B1 * | 11/2002 | Takemura | .................... 438/153 |
| 6,767,775 B1 | 7/2004 | Yudasaka et al. | |
| 6,838,361 B2 | 1/2005 | Takeo | |
| 7,022,534 B2 * | 4/2006 | Gupta et al. | .................... 438/21 |
| 7,229,862 B2 * | 6/2007 | Yamazaki et al. | ........... 438/151 |
| 2005/0026410 A1 * | 2/2005 | Yamazaki et al. | ........... 438/597 |
| 2005/0263765 A1 * | 12/2005 | Maekawa | ...................... 257/69 |
| 2006/0035064 A1 * | 2/2006 | Hirai | ........................ 428/195.1 |

FOREIGN PATENT DOCUMENTS

| | | |
|---|---|---|
| CN | 1297582 A | 5/2001 |
| CN | 1462484 A | 12/2003 |
| JP | 59-075205 A | 4/1984 |
| JP | 2000-353594 A | 12/2000 |
| JP | 2002-076358 A | 3/2002 |

* cited by examiner

*Primary Examiner*—Kevin M. Picardat
(74) *Attorney, Agent, or Firm*—Oliff & Berridge, PLC

(57) ABSTRACT

A method for manufacturing a thin film transistor results in a thin film transistor including a semiconductor film, a channel region provided in the semiconductor film, source and drain regions sandwiching the channel region, and a gate electrode facing the channel region with an intermediary of a gate insulating film. The method includes depositing a droplet that includes a semiconductor material on a substrate; and forming the semiconductor film by drying the droplet to precipitate the semiconductor material on at least a peripheral edge of the droplet.

18 Claims, 26 Drawing Sheets

METHOD FOR MANUFACTURING THIN FILM TRANSISTOR, ELECTRO-OPTICAL DEVICE AND ELECTRONIC APPARATUS

RELATED APPLICATIONS

This application claims priority to Japanese Application Nos. 2004-203385, filed Jul. 9, 2004; 2004-203393, filed Jul. 9, 2004; 2004-203395, filed Jul. 9, 2004; and 2005-55983, filed Mar. 1, 2005, whose contents are explicitly incorporated herein by reference.

FIELD OF THE INVENTION

The present invention relates to a method for manufacturing a semiconductor film and a method for manufacturing a thin film transistor including the semiconductor film.

BACKGROUND OF THE INVENTION

As a method for forming a semiconductor film in a manufacturing process for a thin film transistor, a method has been widely used in which a thin film having a larger area than required is formed using a semiconductor material, and then the thin film is patterned to remove the unnecessary parts. Also, a gate electrode is often fabricated by forming a conductive thin film made of tantalum, aluminum or the like, and then patterning the thin film.

Photolithography is an example of the patterning method. In photolithography, a desired resist pattern is formed on a widely formed thin film by using a photo mask. Then, the part of the thin film not covered by the resist pattern is etched to obtain the thin film having an intended shape. In recent years, trends to realize semiconductor elements with higher integration require fabrication techniques for patterning of lines with a line width under 1 μm, so-called submicron patterning. Therefore, in etching, a method for higher resolution is used in which a finer mask pattern is formed, and an X-ray or electron beam having a shorter wavelength is used for exposure.

A thin film with a fine shape is also formed by an ink jet method. For example, methods have been proposed to discharge a solution including a semiconductor material such as an organic semiconductor material on a substrate by an ink jet discharge device, for forming a semiconductor film. In the case of discharging by the ink jet method, however, the accurate drawing of a fine pattern may be difficult depending on the wettability of the substrate surface, since discharged droplets spread over the surface. In view of the problem, methods for controlling the deposition of droplets have been proposed in which banks are formed on a substrate surface in advance in order to deposit discharged droplets in accordance with a desired pattern. The methods have been disclosed in, for example, Japanese Unexamined Patent Publications No. 59-75205 and No. 2000-353594.

However, in photolithography, equipment for forming a fine mask pattern and for exposure using an X-ray or electron beam is expensive, and throughput is low. Meanwhile, in the ink jet method, thin films on the order of submicrons are difficult to form since the diameter of droplets is typically several microns or more. In the case of using banks, photolithography and etching are necessary for forming the banks, resulting in higher costs and a lower efficiency.

SUMMARY OF THE INVENTION

According to one aspect of the present invention, a method for manufacturing a thin film transistor in which a semiconductor film included in a thin film transistor can be formed with precision on the order of submicrons through simple and inexpensive steps may be provided.

According to another aspect of the present invention, a method for manufacturing a thin film transistor in which a gate electrode included in a thin film transistor can be formed with precision on the order of submicrons through simple and inexpensive steps may be provided.

According to yet another aspect of the present invention, a method for manufacturing a thin film transistor in which a plurality of gate electrodes corresponding to a plurality of thin film transistors can be formed with precision on the order of submicrons through simple and inexpensive steps may be provided.

A method for manufacturing a thin film transistor according to a first aspect of the invention results in a thin film transistor that includes a semiconductor film, a channel region provided in the semiconductor film, source and drain regions sandwiching the channel region, and a gate electrode facing the channel region with intermediary of a gate insulating film. The method includes depositing a droplet that includes a semiconductor material on a substrate, and forming the semiconductor film by drying the droplet to precipitate the semiconductor material on at least a peripheral edge of the droplet.

In a droplet deposited on a substrate, drying at the peripheral edge proceeds faster than at the center typically. Therefore, if a droplet includes a solute or dispersoid (referred to as "solute or the like" collectively, hereinafter), during the drying process of the droplet, the concentration of the solute or the like at the peripheral edge of the droplet first reaches the saturation concentration, initiating the precipitation of the solute or the like. Meanwhile, a liquid flow from the center of the droplet towards the peripheral edge is generated inside the droplet to cover the liquid loss due to evaporation at the peripheral edge. Thus, the solute or the like at the center of the droplet is moved towards the peripheral edge along with the flow so as to be precipitated at the peripheral edge along with the drying of the droplet. A phenomenon is referred to as "pinning" that causes a state in which the solute or the like included in a droplet deposited on a substrate is thus precipitated in an annular shape along the outer circumference of the droplet.

Further, the method for manufacturing a thin film transistor according to the first aspect of the invention is to precipitate the semiconductor material in the peripheral edge of the droplet by utilizing the pinning phenomenon through the above process. Utilizing the pinning phenomenon allows a fine semiconductor film on the order of submicrons to be formed through simple steps. In addition, the shape of a semiconductor film can be controlled by adjusting the drying rate or adjusting the wettability of the surface of a substrate on which a droplet is deposited. Thus, a semiconductor film can be formed in an annular shape, a circular shape or an elliptical shape in which a thin film is also formed at the center part of the droplet. For any shape, the pinning prevents diminishing or breaking of the thin film resulting from contraction of the peripheral edge during the drying. In the case in which the thin film is also formed at the center part of the droplet, the thin film can be processed into a fine shape by removing part of the thin film as described later.

Note that the structure of the "thin film transistor" in the present specification is not limited as long as the thin film transistor includes a channel region provided in a semiconductor film, source and drain regions corresponding to the channel region, and a gate electrode facing the channel region with the intermediary of a gate insulating film. The thin film transistor may be a so-called top-gate transistor in which a semiconductor film, a gate insulating film and a gate electrode are deposited on an insulating substrate in that order, or may be a bottom-gate transistor in which a gate electrode, a gate insulating film and a semiconductor film are deposited on an insulating substrate in that order.

In the method for manufacturing a thin film transistor according to the first aspect of the invention, at least two droplets may be deposited in the depositing of a droplet. Also, the semiconductor material may be precipitated on a peripheral edge of a droplet resulting from coalescence of the at least two droplets.

If at least two droplets are deposited so that the droplets are sufficiently close to each other or part of the droplets overlaps each other, the droplets coalesce with each other since each droplet spreads. Thus, since the shape of a droplet can be changed variously, the flexibility of shape of the obtained semiconductor film can also be enhanced. For example, by arranging plural droplets linearly to make them coalesce with each other, a line droplet can be obtained. If pinning is caused in the line droplet, the semiconductor material is precipitated at the peripheral edge of the droplet and thus a linear semiconductor film with a line width on the order of submicrons can be obtained. Instead of making all droplets coalesce with each other to form one large droplet, coalescence of at least two droplets and precipitation of a semiconductor film at the peripheral edge of the resulting droplet may be repeated for forming a linear semiconductor film.

The method for manufacturing a thin film transistor according to the first aspect of the invention may include, after the depositing of a droplet, increasing the concentration of the semiconductor material at the peripheral edge of the droplet.

Examples of steps for increasing the concentration of a semiconductor material at the peripheral edge of the droplet include applying a temperature gradient to a substrate on which the droplet is deposited to generate convection in the droplet, and discharging a solvent (or dispersion medium) on the droplet disposed on a substrate. Such steps induce the semiconductor material to be brought together at the peripheral edge of the droplet, promoting the precipitation at the peripheral edge. As described above, the difference of concentration of a solute or the like between the center part and peripheral edge of the droplet produces a liquid flow from the center part towards the peripheral edge even if the step for increasing concentration is not implemented. Positively generating a flow that moves the semiconductor material towards the peripheral edge of the droplet by implementing the step, however, can prevent the semiconductor material from remaining at the center of the droplet effectively.

The method for manufacturing a thin film transistor according to the first aspect of the invention may further include removing part of the semiconductor film to separate the semiconductor film, after the forming of the semiconductor film, and forming the gate electrode corresponding to each separated semiconductor film.

For removing the semiconductor film, a method may be used in which an organic solvent is applied to dissolve out the semiconductor material and the dissolved material and solvent are removed, or etching may be used, for example. Precision on the order of submicrons is not required in the removing, and therefore etching can be carried out at low costs relatively. By thus separating the semiconductor film and forming gate electrodes corresponding to each semiconductor film, plural fine thin film transistors of high density can be formed effectively. Also, even if the semiconductor material is precipitated at a place other than the peripheral edge of the droplet, for example, at the center part of the droplet in the drying of the droplet, a fine semiconductor film only on the peripheral edge can be obtained by removing the semiconductor film at the center part in the same manner.

The method for manufacturing a thin film transistor according to the first aspect of the invention further includes, prior to the depositing of a droplet, planarizing the substrate surface.

Chemical mechanical polishing (CMP) or etching can be used for the planarization. In addition, a method for forming a spin-on-glass (SOG) film by spin coating is preferable for obtaining a flat surface in view of costs. Since a flat substrate surface allows a droplet to spread uniformly, patterning of a semiconductor film can be implemented highly accurately.

In the method for manufacturing a thin film transistor according to the first aspect of the invention, the semiconductor film resulting from the pinning may be irradiated with heat or light energy. For the irradiation with heat or light energy, treatment by a rapid thermal process (RTP) or laser irradiation may be employed, for example. This irradiation can enhance the crystallinity of the semiconductor film.

The method for manufacturing a thin film transistor according to the first aspect of the invention may further include, after the forming of the semiconductor film, implanting an impurity into the semiconductor film to form the source and drain regions. This implantation allows the above-described semiconductor film to be used for a thin film transistor.

A method for manufacturing a thin film transistor according to a second aspect of the invention results in a thin film transistor that includes a channel region provided in a semiconductor film, source and drain regions corresponding to the channel region, and a gate electrode facing the channel region with an intermediary of a gate insulating film. The method includes depositing a droplet that includes a conductive material so that a peripheral edge of the droplet faces the channel region, and precipitating the conductive material on at least the peripheral edge of the droplet by drying the droplet, so as to form the gate electrode.

Specifically, the method for manufacturing a thin film transistor according to the second aspect of the invention uses the precipitated conductive film as a gate electrode by utilizing the pinning phenomenon through the above process. Utilizing the pinning phenomenon allows a fine conductive film on the order of submicrons to be formed through simple steps.

In the method for manufacturing a thin film transistor according to the second aspect of the invention, in the depositing of a droplet, the wettability of a surface of the gate insulating film may be controlled to allow the peripheral edge of the droplet to face the channel region.

For controlling the wettability to deposit the droplet so that the peripheral edge of the droplet faces the channel region, for example, a method is used in which a surface modifying film (for example, self-assembled monolayers (SAMs)) having a low affinity for a conductive material is formed on the surface except for positions facing the channel region, and then a droplet including a conductive material is deposited after forming such a surface modifying film. Due to the method, the conductive material is apt to be precipitated at positions facing the channel region while avoiding the region on which the surface modifying film having a low affinity is formed.

In the method for manufacturing a thin film transistor according to the second aspect of the invention, the precipitating of the conductive material may include removing the conductive material precipitated on the center part of the droplet.

As a method for removing the precipitated conductive material, a method may be used in which an organic solvent or acid solution is applied to dissolve the conductive material and the dissolved material and solvent are removed, or etching may be used. Precision on the order of submicrons is not required for removal, and therefore etching can be carried out at relatively low cost. A fine conductive thin film can be obtained only on the peripheral edge by removing the conductive thin film at the center part.

In the method for manufacturing a thin film transistor according to the second aspect of the invention, if a plurality of channel regions is provided in the semiconductor film of one thin film transistor, it is preferable that in the depositing of a droplet, at least one droplet is deposited so that a peripheral edge of the droplet faces the plurality of channel regions, and in the precipitating of the conductive material, a plurality of gate electrodes facing the plurality of channel regions is formed.

Also in the case of highly integrated structure in which a plurality of channel regions is provided in a semiconductor film of one thin film transistor, the manufacturing method according to the second aspect of the invention enables gate electrodes to be formed simply. The deposition of droplets can be controlled by controlling wettability as described above, or controlling the drying. Controlling the drying also enables the conductive material to be precipitated at the center part of the droplet for forming a circular or elliptic conductive thin film. After forming such a thin film, the thin film at the center part can be removed to form gate electrodes.

In the method for manufacturing a thin film transistor according to the second aspect of the invention, the precipitating of the conductive material may include removing part of the conductive material in an annular shape precipitated on the peripheral edge of the droplet, and during removal, the conductive material in an annular shape is separated to form the plurality of gate electrodes facing the plurality of channel regions.

For example, plural gate electrodes having an arc shape are formed by removing and separating part of the conductive material formed in an annular shape. By adopting such a configuration, plural gate electrodes can be formed through simple steps while high performance thin film transistors of higher density having a short gate length can be formed.

In the method for manufacturing a thin film transistor according to the second aspect of the invention, at least two droplets may be deposited in the depositing of a droplet. The conductive material may be precipitated on at least a peripheral edge of a droplet resulting from coalescence of the at least two droplets.

As described above, since the shape of a droplet can be changed variously by making at least two droplets coalesce with each other, the flexibility of shape of the obtained conductive thin film can also be enhanced. For example, by arranging plural droplets linearly to make them coalesce with each other, a line droplet can be obtained. If pinning is caused in the line droplet, the conductive material is precipitated at the peripheral edge of the droplet and thus a linear gate electrode pattern with a line width on the order of submicrons can be obtained. Instead of making all droplets coalesce with each other to form one large droplet, coalescence of at least two droplets and precipitation of a conductive thin film at the peripheral edge of the resulting droplet may be repeated for forming a linear conductive thin film.

The method for manufacturing a thin film transistor according to the second aspect of the invention may include, after the depositing of a droplet, increasing the concentration of the conductive material at the peripheral edge of the droplet.

Examples of steps for increasing the concentration of a conductive material at the peripheral edge of the droplet include a step of applying temperature gradient to a substrate on which the droplet is deposited to generate convection in the droplet, and a step of discharging a solvent (or dispersion medium) on the droplet disposed on a substrate. Such steps induce the conductive material to be brought together at the peripheral edge of the droplet, promoting the precipitation at the peripheral edge. As described above, the difference of concentration of the solute or the like between the center part and peripheral edge of the droplet produces a liquid flow from the center part towards the peripheral edge even if the step for increasing concentration is not implemented. Positively generating a flow that moves the conductive material towards the peripheral edge of the droplet by implementing the step, however, can prevent the conductive material from remaining at the center part of the droplet effectively.

In addition, another aspect of the invention provides a thin film transistor that includes one semiconductor film provided with two channel regions, source and drain regions corresponding to the channel regions, and gate electrodes that are formed of one annular conductive film and face two channel regions with the intermediary of a gate insulating film.

Such a thin film transistor can be manufactured by, in the case of a top gate transistor for example, depositing a droplet including a conductive material on a gate insulating film so that the deposited droplet has a diameter equal to the distance between two channel regions, and then drying the droplet to cause the pinning phenomenon. Such a thin film transistor includes gate electrodes with a very small gate length on the order of submicrons formed at high density with a minute interval, allowing higher integration.

Furthermore, in the case of the thin film transistor having two channel regions, a pair of source and drain regions sandwiching two channel regions may be formed. Alternatively, two thin film transistors may be formed corresponding to two channel regions. As an application of the former, the invention encompasses a so-called multi-gate thin film transistor in which at least three gate electrodes corresponding to a pair of source and drain regions are formed. The amount of current to be supplied is increased corresponding to the increase of gate electrodes, resulting in the higher performance. The increase of gate electrodes reduces the amount of current per gate electrode, for the same current amount, and therefore is preferable since both current loss and heat generation can be suppressed. In the case in which two thin film transistors are formed corresponding to two channel regions, a complementary MOS transistor can be formed in which one thin film transistor is an N-channel MOS transistor while the other is a P-channel MOS transistor.

A method for manufacturing a thin film transistor according to a third aspect of the invention results in at least two thin film transistors that each include a semiconductor film provided with a channel region, source and drain regions facing each other sandwiching the channel region, and a gate electrode facing the channel region with an intermediary of a gate insulating film. The method includes depositing a droplet that includes a conductive material so that at least part of a peripheral edge of the droplet faces at least one channel region, and precipitating the conductive material on the peripheral edge of the droplet to form the gate electrode. Here, each gate electrode is coupled to at least one other gate electrode.

Specifically, in the method for manufacturing a thin film transistor according to the third aspect of the invention, a droplet including a conductive material is dropped to form a conductive thin film by utilizing the above-described "pinning phenomenon", and the conductive thin film is used as a gate electrode. Therefore, an annular gate electrode with a line width on the order of submicrons can be obtained easily at low costs while a plurality of gate electrodes corresponding to a plurality of thin film transistors can be formed easily.

The conductive thin film can be precipitated in an annular shape. Alternatively, the thin film can also be precipitated in a shape other than an annular shape by controlling the drying rate and contact angle of a droplet including a conductive material, and the particle diameter and concentration of the conductive material, or by depositing a droplet on the droplet that has been deposited. Which shape or control method is employed depends on the design.

The method for manufacturing a thin film transistor according to the third aspect of the invention is to electrically couple each of the formed gate electrodes with at least one other gate electrode. This coupling can be obtained by depositing a droplet so that the peripheral edge of the droplet faces plural channel regions even if only one droplet is deposited.

In the case of depositing at least two droplets, the droplets are deposited so that at least part of a peripheral edge of each droplet faces at least one channel region, and so that at least part of the peripheral edge of each droplet overlaps a peripheral edge of at least one other droplet. Thereby, each gate electrode can be electrically coupled to at least one other gate electrode.

Such a configuration allows a multi-channel transistor to be obtained in which plural thin film transistors are coupled in parallel. Thus, plural transistors can be driven by one gate signal.

A method for manufacturing a thin film transistor according to a fourth aspect of the invention results in at least two thin film transistors that each include a semiconductor film provided with a channel region, source and drain regions facing each other sandwiching the channel region, and a gate electrode facing the channel region with an intermediary of a gate insulating film. The method includes depositing a droplet that includes a conductive material so that at least part of a peripheral edge of the droplet faces at least one channel region, precipitating the conductive material on the peripheral edge of the droplet to form the gate electrode, and separating the gate electrode that faces the channel region from another gate electrode that faces another channel region to form the gate electrodes having a shape of separated islands.

According to this method, the conductive thin film formed by the pinning phenomenon is separated to form gate electrodes. Thereby, plural gate electrodes corresponding to plural thin film transistors can be formed easily while fine gate electrodes can be obtained at high density.

The gate electrode may be separated by, for example, removing part of the precipitated gate electrode. The conductive thin film can be removed by, for example, etching, or a method of supplying an alkaline solvent to dissolve the thin film and then removing the conductive material as well as the solvent.

In the method for manufacturing a thin film transistor according to the fourth aspect of the invention, the manufactured thin film transistors each may have one gate electrode with a pair of the source and drain regions being formed for each gate electrode. Such a configuration allows multiple transistors to be formed at high density. It will be appreciated that the invention encompasses a structure in which source and/or drain regions may be shared by one film transistor and other neighboring thin film transistors.

Furthermore, in the depositing of a droplet, a droplet may be deposited to overlap part of the conductive material precipitated on a peripheral edge of a previously deposited droplet to redisperse part of the conductive material. By adopting such a configuration, the flexibility of shape of the precipitated conductive thin film can be further enhanced.

At least two droplets may be deposited in the depositing of a droplet. Also, the conductive material may be precipitated on at least a peripheral edge of a droplet resulting from coalescence of the at least two droplets. Thus, for example, a larger annular conductive thin film, a linear conductive thin film or the like can be obtained.

In the method for manufacturing a thin film transistor according to aspects of the invention, the semiconductor film of each manufactured thin film transistor may have a shape of an island separated from the semiconductor film of another thin film transistor.

The method for manufacturing a thin film transistor according to aspects of the invention may further include, prior to the depositing of a droplet, forming the gate insulating film having a flat surface on each channel region. The flat surface of the insulating film allows the deposited droplet to spread uniformly, and thus the shape of the droplet can be controlled easily.

The method for manufacturing a thin film transistor according to the second or third aspect of the invention may include, prior to the depositing of a droplet, forming the gate insulating film having a flat surface on each channel region. In addition, in the depositing of a droplet, a droplet may be deposited on the gate insulating film.

The flat gate insulating film can be formed of, for example, a coated insulating film. If an SOG film is formed by spin coating on a substrate having a semiconductor pattern thereon, for example, the insulating film may be formed thinly on a region having the semiconductor pattern while being formed thickly on a region having no semiconductor pattern, enabling the insulating film having a flat surface to be obtained. An SOG film of one layer may be deposited. Also, an SOG film may be used as a planarizer instead of the above-described CMP. In contrast, if an insulating film is formed on a semiconductor film by sputtering, the insulating film may involve steps to handle portions deposited on the semiconductor film and portions deposited on a region having no semiconductor film. In this case, the flat surface can be formed by CMP, etching or the like.

The flat surface of a gate insulating film allows a droplet deposited on the gate insulating film to spread uniformly. Thus, a droplet having a desired shape can be deposited easily, allowing the accurate patterning of gate electrodes.

Furthermore, another aspect of the invention encompasses an electro-optical device and an electronic apparatus that include a thin film transistor manufactured by the method for manufacturing a thin film transistor according to the above-described aspects of the invention.

Here, the term electro-optical device refers to a general device including an electro-optical element that has a thin film transistor according to aspects of the invention, and emits light by electrical operation or changes the condition of external light. The term electro-optical device encompasses both a self-emitting device and a device controlling the passage of external light. For example, the term electro-optical device refers to an active matrix display that includes, as an electro-optical element, a liquid crystal element, an electrophoretic element that has a dispersion medium including dispersed electrophoretic particles, an electro-luminescence (EL) element, or an electron emission element that induces electrons resulting from application of an electric field to impinge on a light-emitting plate to emit light.

In addition, the term electronic apparatus refers to a general apparatus that includes a thin film transistor according to the aspects of the invention and exerts certain functions. The electronic apparatus includes, for example, an electro-optical device and a memory. The structure of the electronic apparatus is not particularly limited. The electronic apparatus encompasses, for example, an IC card, cellular phone, video camera, personal computer, head mount display, rear or front-type projector, facsimile device with a display function, a digital camera finder, portable TV, DSP device, PDA, electronic notebook, electronic signboard, and advertisement display.

Furthermore, yet another aspect of the invention provides a method for manufacturing a semiconductor device that includes a semiconductor element formed using a semiconductor film formed on a substrate. The method includes depositing a droplet that includes a semiconductor material on the substrate, and drying the droplet to precipitate the semiconductor material on at least a peripheral edge of the droplet, for forming the semiconductor film. This manufacturing method enables fine semiconductor films to be formed at high density through simple steps.

BRIEF DESCRIPTION OF THE DRAWINGS

The invention will be described with reference to the accompanying drawings, wherein like numbers refer to like elements, and wherein.

DESCRIPTION OF ILLUSTRATIVE EMBODIMENTS

Embodiments of the invention will be described below with reference to the drawings.

First Embodiment

FIGS. 1A to 1E and FIGS. 2A to 2E are explanatory diagrams illustrating a method for manufacturing a semiconductor film in accordance with the method for manufacturing a thin film transistor of the first aspect of the invention. In the present embodiment, droplets including a semiconductor material are deposited on an insulating substrate and are then dried for forming a semiconductor film utilizing a pinning phenomenon.

Step for Forming an Insulating Film

Figure 1A:
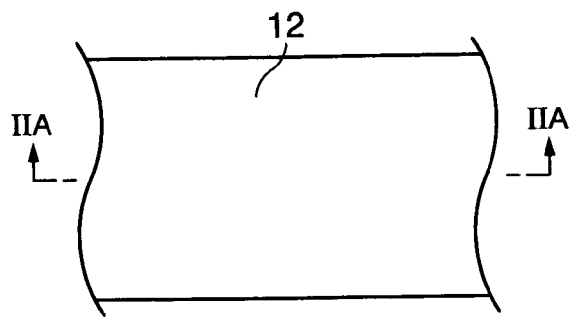
FIGS. 1A to 1E are explanatory diagrams of a semiconductor device according to a first illustrative embodiment of the invention.
Figure 2A:
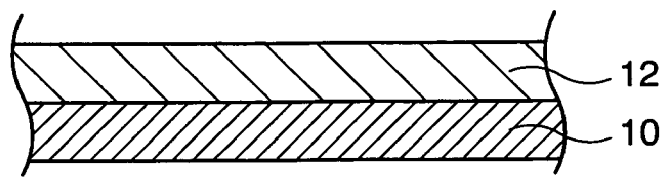
FIGS. 2A to 2E are explanatory diagrams of the semiconductor device according to the first illustrative embodiment.

FIG. 1A is a plan view of a substrate on which an insulating film 12 is formed. FIG. 2A is a sectional view along line IIA-IIA in FIG. 1A. The insulating film 12 is formed on a substrate 10 made of an insulating material such as glass as shown in FIG. 2A. In the present embodiment, a silicon oxide film is formed as the insulating film 12. The silicon oxide film can be deposited by, for example, plasma enhanced chemical vapor deposition (PECVD), low pressure chemical vapor deposition (LPCVD) or physical vapor deposition such as sputtering. Alternatively, a spin-on-glass (SOG) film may be formed by a coating method. After depositing a film, if the surface thereof is not sufficiently flat, the surface is planarized by wet etching employing a fluorinated acid or chemical mechanical polishing (CMP). Since an SOG film deposited by spin coating is flat, no planarizing step is required. The planarization eliminates recesses and projections on the surface of the insulating film 12, allowing the uniform spreading of droplets. Thus, the deposition of droplets having a desired shape is facilitated.

Step for Depositing a Droplet

Figure 1B:
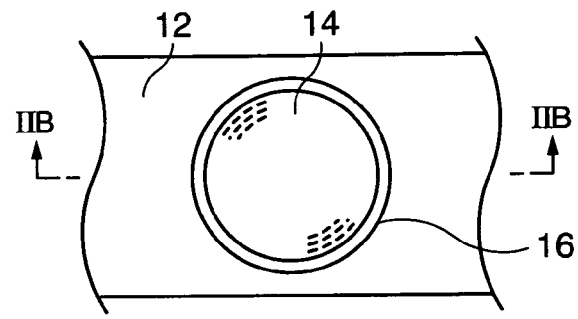
Figure 2B:
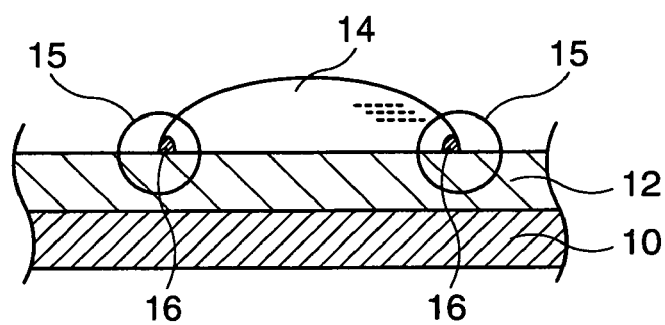

As shown in FIG. 1B, a droplet 14 including a semiconductor material is deposited on the insulating film 12. FIG. 2B is a sectional view along line IIB-IIB in FIG. 1B.

For example, an organic semiconductor material is used as the semiconductor material. An organic semiconductor material is soluble in a nonpolar organic solvent such as xylene, toluene or trimethylbenzene, and therefore can be deposited on the insulating film 12 as a droplet. Examples of an organic semiconductor material may include, but are not limited to, low-molecular-weight compounds such as naphthalene, anthracene, tetracene, pentacene and hexacene; and polymer compounds such as an oxadiazole derivative (PBD), oxadiazole dimmer (OXD-8), beryllium-benzoquinolinol complex (Bebq), triphenylamine derivative (MT-DATA), triarylamine derivative, triazole derivative, polyphenylene, poly(alkylfluorene), poly(alkylthiophene) ($P_3HT$), polyvinylpyrene, polyvinylanthracene and F8T2 (poly(9,9-dioctylfluorene-co-bithiophene)). The organic semiconductor is preferable since it can be processed at room temperature and thus can be fabricated at low cost without large-scale fabrication apparatuses. The droplet including a semiconductor material may be formed of a liquid prepared by dissolving at least one silicon compound selected from the group consisting of cyclopentasilane and silylcyclopentasilane in an organic solvent such as toluene. Using this material permits the formation of an inorganic semiconductor film.

For depositing the droplet 14 on the insulating film 12, there are methods employing a micro pipette, micro dispenser, ink jet and so forth. The ink jet method, which allows accurate patterning, is preferable. The ink jet method is conducted by using an ink jet discharge device to be described later.

Step for Precipitating a Semiconductor Material

As shown in FIGS. 1B and 2B, in the droplet 14 deposited on the insulating film 12, the drying rate of liquid is larger at a peripheral edge 15 than at the center part. Therefore, in the peripheral edge 15 first, the concentration of the semiconductor material reaches a saturation concentration and thus precipitation of the material is initiated. Then, the "pinning phenomenon" is caused in which the precipitated semiconductor material pins the peripheral edge of the droplet, suppressing contraction of the droplet (external diameter) during the subsequent drying. Since the drying rate at the peripheral edge 15 is larger than the rate at the center part, a liquid flow from the center part of the droplet towards the peripheral edge 15 is generated, and thus the semiconductor material is moved towards the peripheral edge 15. As a result, an annular semiconductor film 16 in accordance with the external shape of the droplet is formed.

Figure 1C:
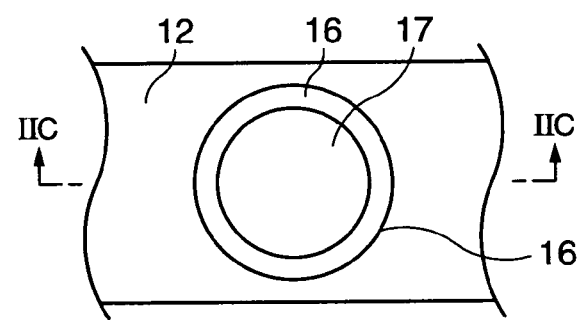
Figure 2C:
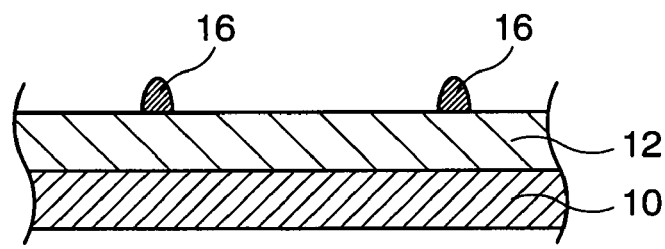

FIG. 1C illustrates a state in which the droplet has been completely dried and therefore the semiconductor material is precipitated along the droplet periphery, resulting in the formation of the semiconductor film 16. FIG. 2C is a sectional view along line IIC-IIC in FIG. 1C. The semiconductor film 16 has an annular shape with a line width of 1 µm or less.

During the drying of the droplet 14, the concentration of the semiconductor material at the peripheral edge of the droplet may be controlled. For example, by adjusting the temperature of the substrate and discharging a droplet again on the semiconductor film that has been dried, the vaporization condition and viscosity of the droplet can be controlled. Thus, convection can be caused in the droplet, and effective movement of the semiconductor material towards the peripheral edge 15 can occur. This control induces the semiconductor material to be gathered at the droplet periphery and prevents the semiconductor material from remaining at a center part 17 of the droplet 14 more effectively, allowing precipitation of the annular semiconductor material with a small line width. Therefore, this semiconductor film can be used for forming a semiconductor element without patterning.

The crystallinity of the obtained semiconductor film 16 may be improved by irradiation with heat or light energy. For example, heat treatment by a rapid thermal process (RTP), or irradiation with light energy such as an X-ray, ultraviolet rays, visible ray, infrared ray (heat ray), laser light, milliwave, microwave, electron beam or radiation ray (α-ray, β-ray or γ-ray) can be used. Particularly, laser light permitting high-output irradiation is preferable. As the laser light, various gas lasers, solid-state lasers (semiconductor lasers) or the like can be used. Particularly, an excimer laser, Nd-YAG laser, Ar laser, $CO_2$ laser, He—Ne laser or the like may be used. Of the lasers, an excimer laser having wavelength of 350 nm or less, whose irradiation energy is absorbed at the surface of the semiconductor film, is preferable.

Step for Forming an Element

Subsequently, by taking as an example a thin film transistor, a step for forming a semiconductor element by using the semiconductor film manufactured through the above-described manufacturing method will be described.

Figure 1D:
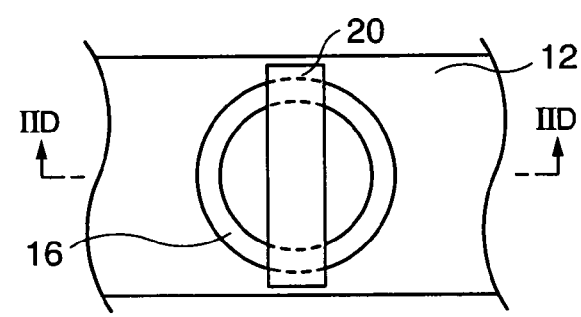
Figure 2D:
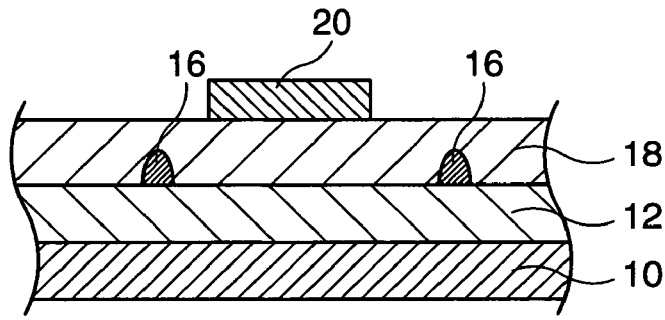

FIGS. 1D and 2D illustrate a state in which a gate insulating film 18 and a gate electrode 20 are formed. FIG. 2D is a sectional view along line IID-IID in FIG. 1D.

As shown in FIG. 2D, the gate insulating film 18 and the gate electrode 20 are formed on the semiconductor film 16. The gate insulating film 18 is formed of a silicon oxide film, for example. The silicon oxide film may be formed by a deposition method such as electron cyclotron resonance PECVD (ECR-PECVD), or may be formed of an SOG film, for example. The gate electrode 20 can be formed by forming a conductive thin film of tantalum, aluminum or the like by a deposition method such as sputtering, and then patterning the thin film.

In FIG. 1D, the gate insulating film 18 is not illustrated in order to show the positional relationship between the semiconductor film 16 and the gate electrode 20. The gate electrode 20 is disposed to pass transversely across the annular semiconductor film 16.

Then, an impurity element serving as a donor or acceptor may be implanted using the gate electrode 20 as a mask, namely so-called self-alignment ion implantation may be implemented. Thereby, source/drain regions 22 and a channel region 23 are formed in the semiconductor film 16. For example, phosphorous (P) may be implanted as the impurity element, and thereafter the impurity element may be activated by irradiating the semiconductor film with an XeCl excimer laser with the energy density of about 400 mJ/cm$^2$. Thereby, N-type source/drain regions are formed. Heat treatment at a temperature in the range of about 250-400° C. may be implemented for activating the impurity element instead of laser irradiation.

Figure 1E:
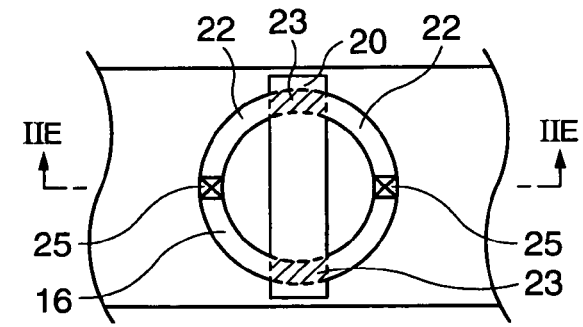
Figure 2E:
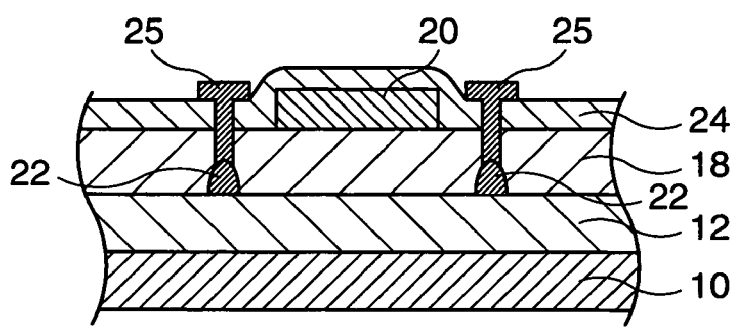

FIGS. 1E and 2E illustrate a step for forming an interlayer insulating film and source/drain electrodes. FIG. 2E is a sectional view along line IIE-IIE in FIG. 1E. As shown in FIG. 2E, an interlayer insulating film 24 made of a silicon oxide film or the like is formed to cover the gate insulating film 18 and the gate electrode 20. The silicon oxide film is formed to have a thickness of about 500 nm by a deposition method such as PECVD or SOG. Subsequently, contact holes reaching the source/drain regions 22 are formed through the gate insulating film 18 and the interlayer insulating film 24. Then, a conductive material such as aluminum or tungsten is buried in the contact holes by a deposition method such as sputtering and then is patterned to form source/drain electrodes 25. Thus, a thin film transistor is formed.

In FIG. 1E, the illustrations of the gate insulating film and interlayer insulating film are omitted in order to clearly show the positional relationship among the source/drain regions 22, the gate electrode 20, the source/drain electrodes 25 and so forth. Portions of the annular semiconductor film above which the gate electrode is not deposited serve as the source/drain regions 22, while portions of the annular semiconductor film above which the gate electrode is deposited serve as the channel regions, constituting the thin film transistor. The source/drain electrodes are formed at the center of the source/drain regions.

As described above, in the present embodiment, a semiconductor film having a predetermined shape can be formed through simple steps: depositing liquid including a semiconductor material, and drying the liquid. In addition, the subsequent insulating film forming step and so forth can be implemented without patterning the semiconductor film.

Droplet Discharge Device

Figure 3:
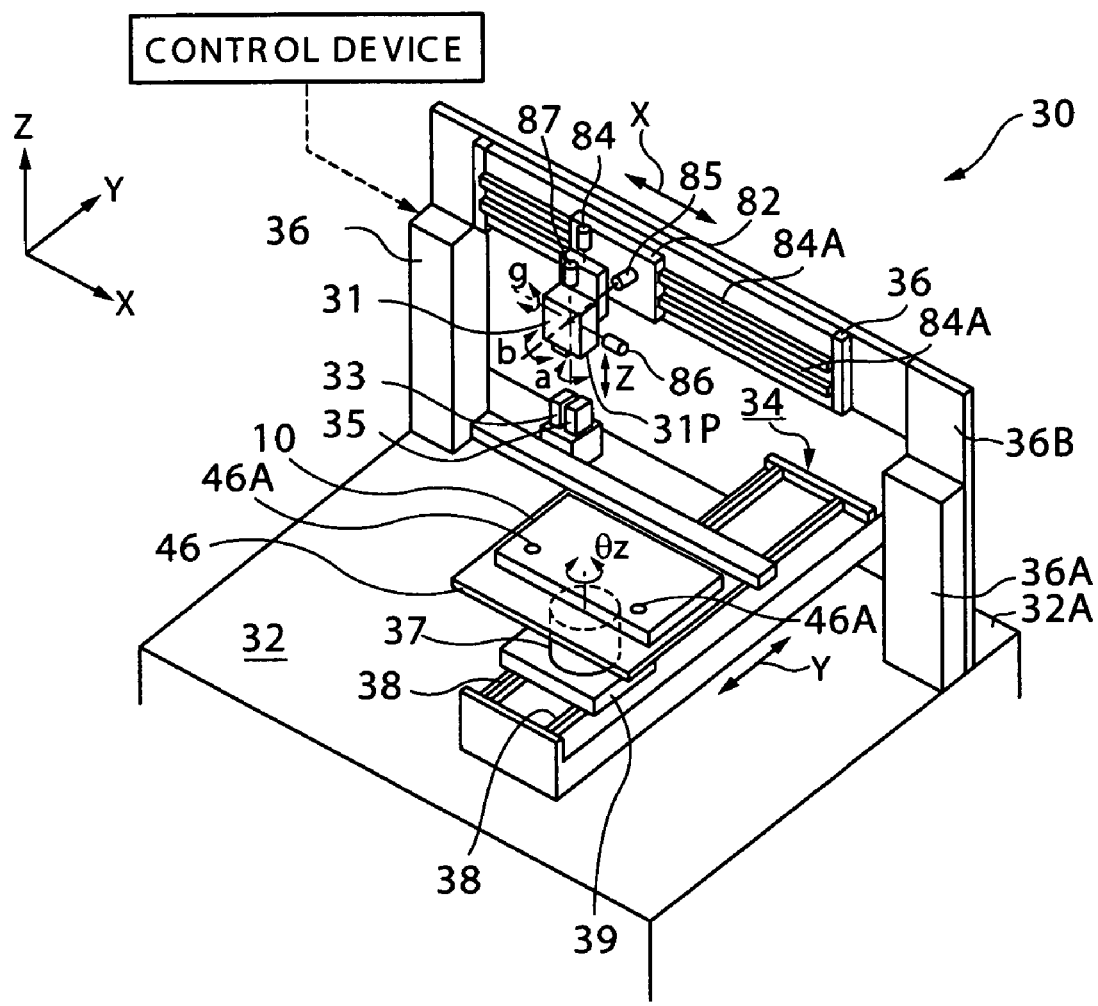
FIG. 3 is a perspective view of an illustrative ink jet discharge device.

The above-described droplet is formed by discharging liquid from an ink jet discharge device. The ink jet discharge device will be described referring to FIG. 3. FIG. 3 is a perspective view of an ink jet discharge device 30. The ink jet discharge device 30 mainly includes a base 32, a first movement unit 34, a second movement unit 36, an electronic balance (not shown) serving as a weight measurement device, a head 31, a capping unit 33, and a cleaning unit 35. The operation of the ink jet discharge device 30 including the first and second movement units 34 and 36 is controlled by a control device. In FIG. 3, the X-direction corresponds to the horizontal direction of the base 32. Also, the Y and Z-directions correspond to the anteroposterior and vertical directions, respectively.

The first movement unit 34 is directly disposed on the top surface of the base 32 with two guide rails 38 being parallel to the Y-direction. The first movement unit 34 has a slider 39 that can move along the two guide rails 38. For example, a linear motor may be used for driving the slider 39. Thus, the slider 39 can be moved along the Y-direction and can be positioned at any position.

A motor 37 is fixed on the top surface of the slider 39, and a table 46 is fixed to a rotor of the motor 37. The table 46 is used for positioning the substrate 10 while holding the substrate 10. Specifically, the operation of an attracting holder (not shown) causes the substrate 10 to be attracted through a hole 46A of the table 46, allowing the holding of the substrate 10 on the table 46. The motor 37 is, for example, a direct drive motor. Powering the motor 37 leads to rotation of the rotor and the table 46 in the qz-direction. The table 46 includes a preliminary discharge area for allowing sacrifice discharge or proof discharge (preliminary discharge) of a liquid by the head 31.

Meanwhile, two support columns 36A are placed upright on the backside of the base 32. A column 36B is mounted on the upper ends of the support columns 36A. The second movement unit 36 is mounted on the whole surface of the column 36B. The second movement unit 36 includes two guide rails 84A disposed along the X-direction and a slider 82 that can move along the guide rails 84A. For example, a linear motor may be used for driving the slider 82. Thus, the slider 82 can be moved along the X-direction and can be positioned at any position.

The head 31 is mounted on the slider 82. The head 31 is coupled to motors 84, 85, 86 and 87 that serve as a swing positioning unit. The motor 84 can move the head 31 along the Z-direction and can position the head 31 at any position. The motor 85 can swing the head 31 in the b-direction around the Y-axis and can position the head 31 at any position. The motor 86 can swing the head 31 in the g-direction around the X-axis and can position the head 31 at any position. The motor 87 can swing the head 31 in the a-direction around the Z-axis and can position the head 31 at any position.

As described above, the substrate 10 can be moved along the Y-direction and positioned, and can be swung in the qz-direction and positioned. Also, the head 31 can be moved along the X- and Y-directions and positioned, and can be swung in the a-, b- and g-directions and positioned. Therefore, the ink jet discharge device 30 can accurately control the relative position and posture between an ink discharge surface 31P of the head 31 and the substrate 10 on the table.

Ink Jet Head

Figure 4:
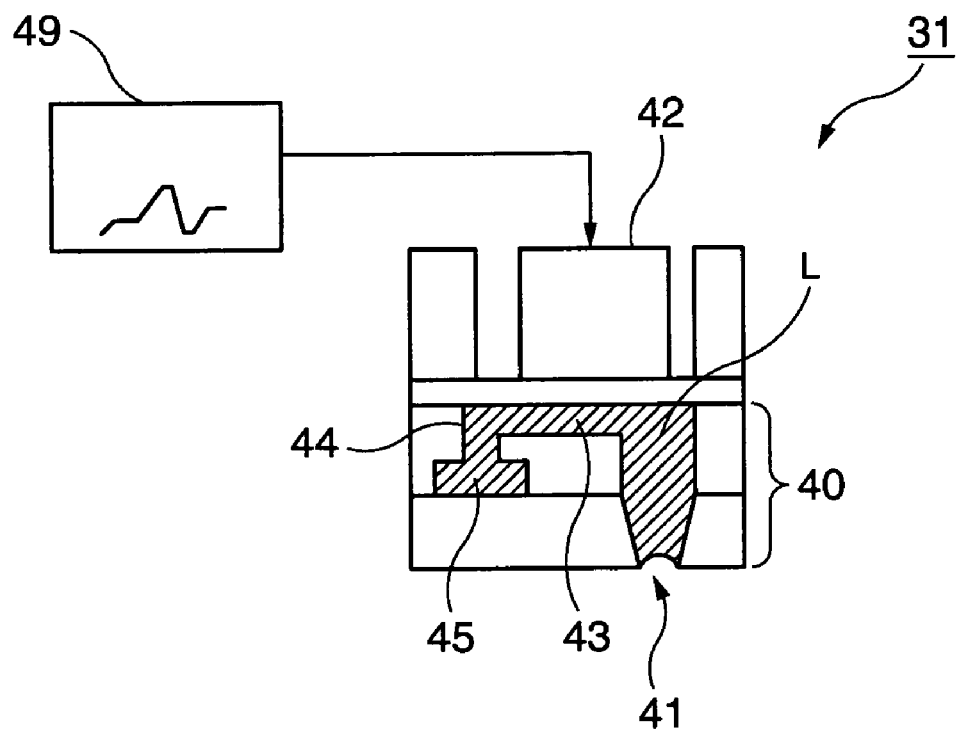
FIG. 4 is a side sectional view of an illustrative ink jet head.

The structure of the head 31 will be described referring to FIG. 4. FIG. 4 is a side sectional view of an ink jet head. The head 31 discharges a liquid L from a nozzle 41 by a droplet discharge method. As the droplet discharge method, publicly known various techniques can be used, such as a piezo method for discharging liquid by using piezo elements as piezoelectric elements and a method for discharging liquid by utilizing bubbles resulting from heating the liquid. Of these methods, the piezo method has an advantage of having no effect on the composition of the material since no heat is applied to liquid. The head 31 of FIG. 4 employs the piezo method.

A reservoir 45 and a plurality of ink chambers 43 branched from the reservoir 45 are formed in a main body 40 of the head 31. The reservoir 45 serves as a channel for supplying the liquid L to each ink chamber 43. A nozzle plate constituting an ink discharge surface is mounted on the lower surface of the head main body 40. The plural nozzles 41 for discharging the liquid L are opened in the nozzle plate correspondingly to the respective ink chambers 43. An ink channel is formed from each ink chamber 43 towards the corresponding nozzle 41. Meanwhile, a diaphragm 44 is mounted on the upper surface of the head main body 40. The diaphragm 44 constitutes a wall of the ink chamber 43. A piezo element 42 is provided outside the diaphragm 44 corresponding to each ink chamber 43. The piezo element 42 includes a pair of electrodes (not shown) and a piezoelectric material such as quartz interposed between the electrodes. The pair of electrodes is coupled to a driving circuit 49.

Applying voltage to the piezo element 42 by the driving circuit 49 leads to the expansion or contraction of the piezo element 42. The contraction of the piezo element 42 lowers the pressure in the ink chamber 43, causing the liquid L to flow from the reservoir 45 to the ink chamber 43. In contrast, the expansion of the piezo element 42 increase the pressure in the ink chamber 43, resulting in the discharging of the liquid L from the nozzle 41. It will be appreciated that the deformation rate of the piezo element 42 can be controlled by varying the frequency of applied voltage. That is, discharge conditions for the liquid L can be controlled by controlling voltage to be applied to the piezo element 42.

Referring back to FIG. 3, the ink jet discharge device includes the capping unit 33 and the cleaning unit 35. The capping unit 33 is a unit for capping the ink discharge surface 31P during a pause mode of the ink jet discharge device 30 in order to prevent the ink discharge surface 31P of the head 31 from being dried. The cleaning unit 35 is a unit for taking suction from nozzles in order to eliminate clogging of the nozzles of the head 31. The cleaning unit 35 may also wipe the ink discharge surface 31P in order to remove undesirable substances on the ink jet discharge surface 31P of the head 31.

Second Embodiment

FIGS. 5A to 5D and FIGS. 6A to 6D illustrate a method for manufacturing a semiconductor film according to a second embodiment of the invention. The present embodiment will also be described by taking as an example a thin film transistor. In the present embodiment, not only a semiconductor film but also a gate electrode is formed by depositing liquid including a conductive material and drying the liquid.

Step for Forming a Semiconductor Film

Figure 5A:
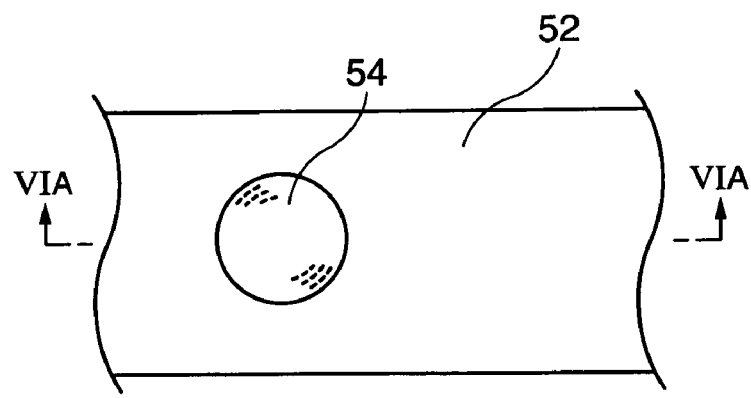
FIGS. 5A to 5D are explanatory diagrams of a semiconductor device according to a second illustrative embodiment of the invention.
Figure 5B:
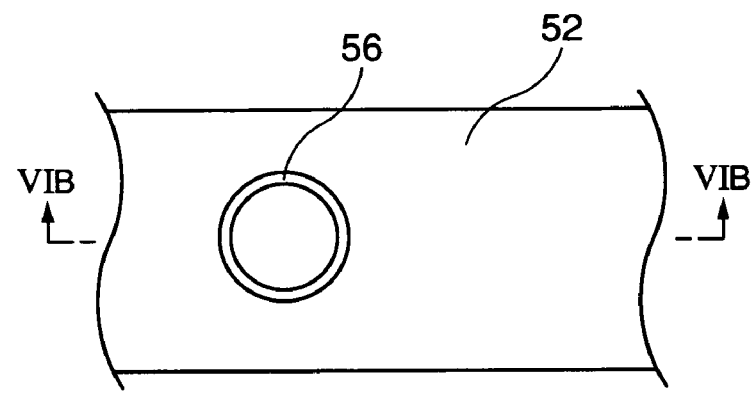
Figure 6A:
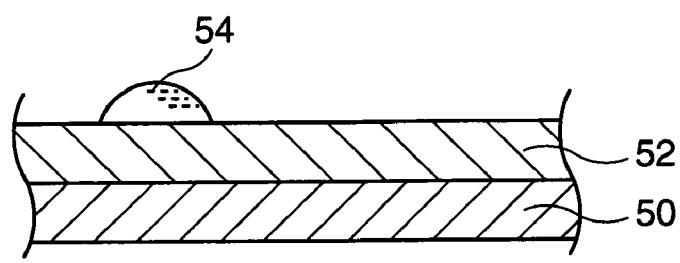
FIGS. 6A to 6D are explanatory diagrams of the semiconductor device according to the second illustrative embodiment.
Figure 6B:
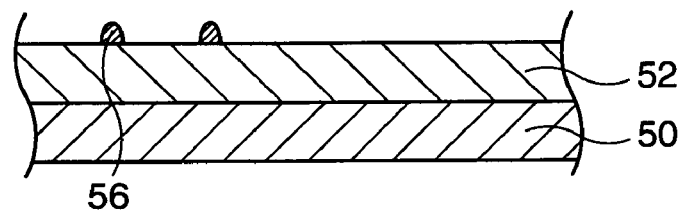
Figure 6B:
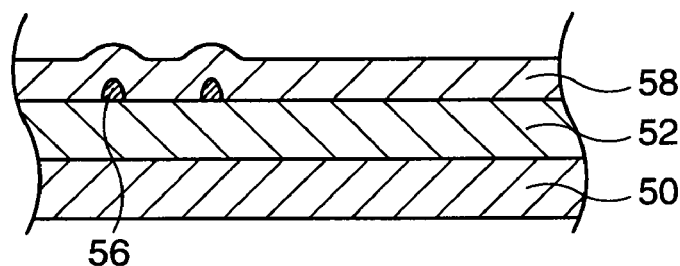

First, as shown in FIGS. 5A and 5B, a droplet 54 including a semiconductor material is deposited on an insulating film 52 and then is dried to obtain a semiconductor film 56. FIGS. 6A and 6B illustrate sectional views along line VIA-VIA in FIG. 5A and line VIB-VIB in FIG. 5B, respectively. The insulating film 52 is deposited on a substrate 50 such as a glass substrate. The steps for forming an insulating film, for depositing a droplet and for precipitating a semiconductor material are implemented in the same way as those of the first embodiment, and therefore the detailed description thereof will be omitted.

Step for Forming a Gate Electrode

Subsequently, with reference to FIGS. 5C and 5D and FIGS. 6B' to 6D, the description will be made about a step for forming a gate electrode for a semiconductor element including the semiconductor film manufactured through the above-described manufacturing method. FIGS. 6C and 6D illustrate sectional views along line VIC-VIC in FIG. 5C and line VID-VID in FIG. 5D, respectively. In FIG. 5D, the gate insulating film 58 is not illustrated in order to show the positional relationship between the semiconductor film and gate electrode.

First, a step for forming the gate insulating film 58 on the semiconductor film 56 will be described referring to FIG. 6B'. The gate insulating film 58 is formed of a silicon oxide film, for example. The silicon oxide film may be formed by a deposition method such as ECR-PECVD. In the gate insulating film 58 formed in such a way, steps between the region on the semiconductor film 56 and the other region may be caused as shown in FIG. 6B'. If there are recesses and projections on the gate insulating film 58, the surface is planarized. For example, CMP or etch-back may be used as a planarization method. This planarization results in the uniform spreading of a droplet including a conductive material on the gate insulating film 58, facilitating the control of the droplet shape. If an SOG film is used as the gate insulating film, the SOG film automatically eliminates steps due to the semiconductor film 56, providing the flat surface of the gate insulating film.

Figure 5C:
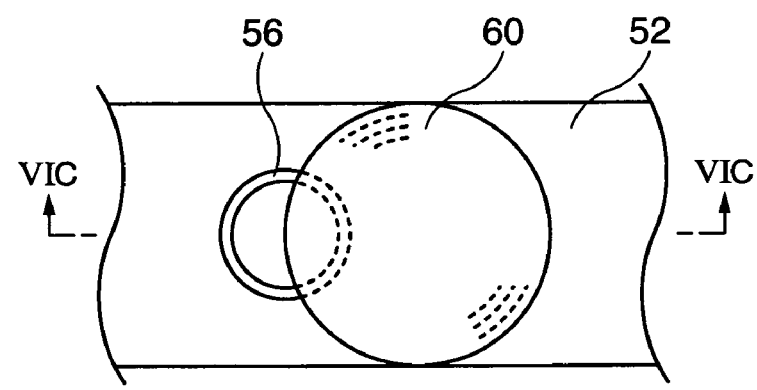
Figure 5D:
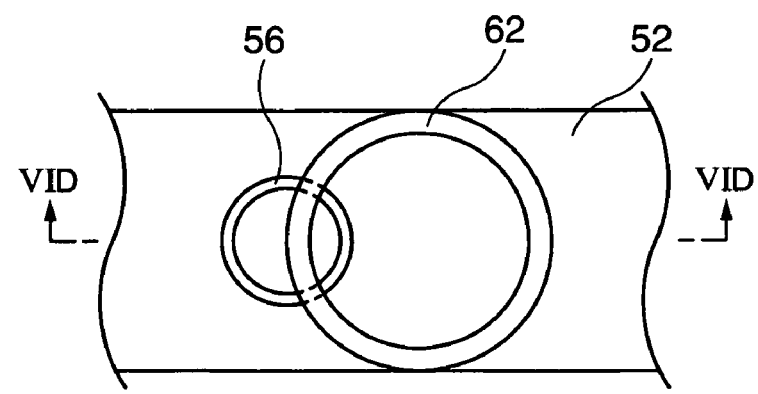
Figure 6C:
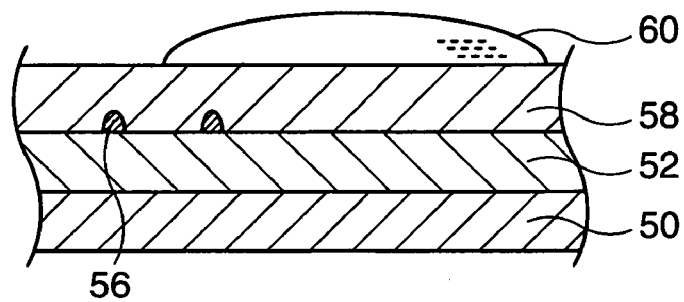
Figure 6D:
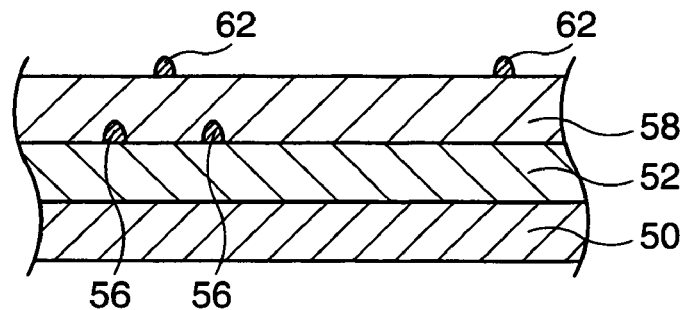

Then, as shown in FIGS. 5C and 6C, a droplet 60 including a gate electrode material is deposited on the gate insulating film 58. Conductive fine particles are preferable as the gate electrode material. For example, fine particles of Ag, Au, Cu or the like with the diameter of about several nanometers may be used. The fine particles are dispersed in water or an organic dispersion medium such as tetradecane, and are deposited on the gate insulating film 58 as a droplet by using an ink jet method or another method.

As shown in FIGS. 5D and 6D, the drying of the droplet 60 initiates precipitation of the gate electrode material at a peripheral edge of the droplet, resulting in the formation of an annular gate electrode 62 along the outer periphery of the droplet. The gate electrode 62 is disposed so that part of the gate electrode 62 passes transversely across the semiconductor film 56. In order to prevent the conductive material from remaining at the center of the droplet, positive control for gathering the gate electrode material at the peripheral edge of the droplet may be implemented. The control method may be the same as that used for the above-described semiconductor film, and therefore the detailed description thereof will be omitted.

Step for Forming an Element

Subsequently, an impurity element to serve as a donor or acceptor may be implanted utilizing the gate electrode 62 as a mask, forming source/drain regions in the semiconductor film 56. Next, an interlayer insulating film is formed to cover the gate electrode 62 and the gate insulating film 58, and then contact holes are formed through the interlayer insulating film and gate insulating film. Thereafter, a conductive material is buried in the contact holes to form source/drain electrodes. These steps can be implemented in the same manner as those in the first embodiment, and therefore the detailed description thereof will be omitted.

The method of the present embodiment enables not only a semiconductor film but also a gate electrode to be formed in a short time through the steps of depositing and drying a droplet. The gate electrode with a line width of 1 μm or less can be formed. Thus, by implanting an impurity using the gate electrode as a mask to form source/drain regions, a thin film transistor with a gate length of 1 μm or less can be obtained. Since a shorter gate length provides a smaller gate capacitance, a high performance thin film transistor can be formed.

Third Embodiment

Figure 7A:
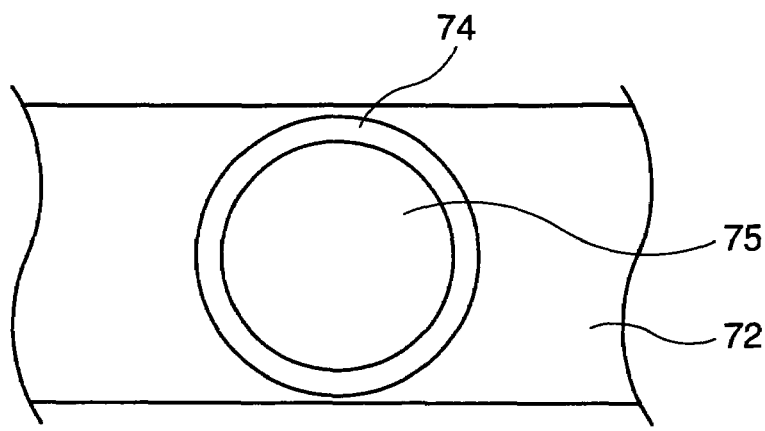
FIGS. 7A to 7C are explanatory diagrams of a semiconductor device according to a third illustrative embodiment of the invention.
Figure 7B:
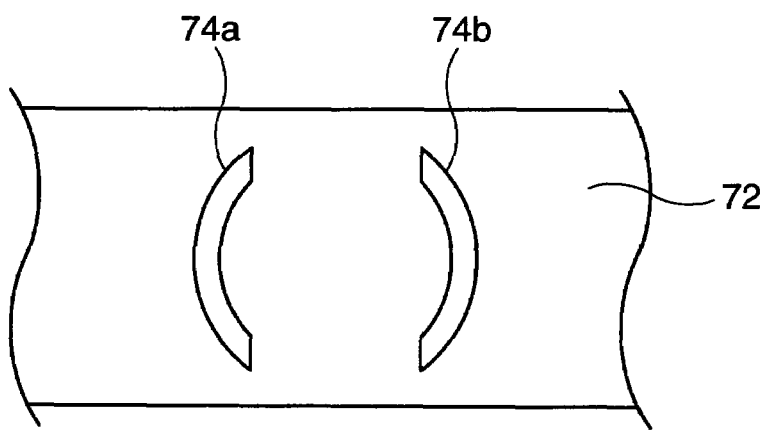
Figure 7C:
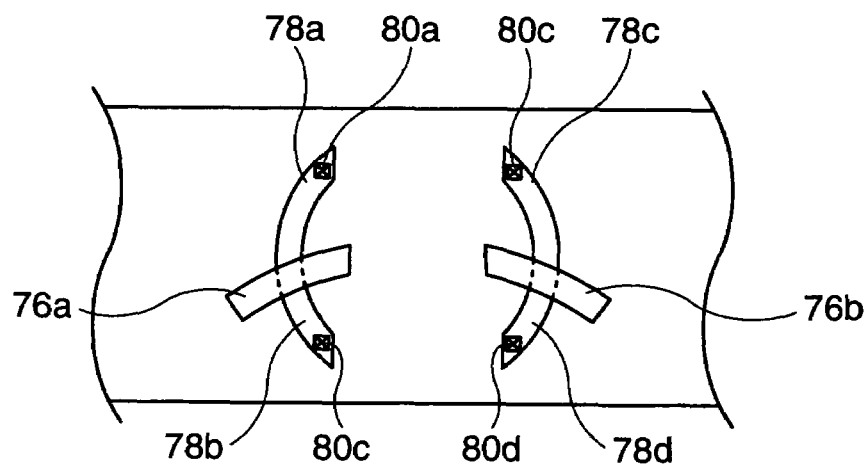

FIGS. 7A to 7C schematically illustrate a method for manufacturing a semiconductor film according to a third embodiment of the invention. In the present embodiment, two thin film transistors are fabricated by utilizing one semiconductor film resulting from the deposition and drying of a droplet.

First, as shown in FIG. 7A, a semiconductor film 74 is formed on an insulating film 72 in the same way as that of the first and second embodiments. Subsequently, as shown in FIG. 7B, part of the semiconductor film is removed to obtain semiconductor films 74a and 74b. For removing part of the semiconductor film 74, a method may be used in which the solvent of the droplet is applied on a desired place to dissolve the semiconductor material and the dissolved material and solvent are removed, or etching may be used, for example. The area of the removal region is relatively large and therefore removal precision on the order of submicrons is not required. Thus, etching may employ a typical, inexpensive method rather than a high precision method.

Next, a gate insulating film (not shown) is formed to cover the semiconductor film 74, and therefore gate electrodes 76a and 76b are formed to pass transversely across the center of the semiconductor films 74a and 74b, respectively. The gate electrodes are formed by the pinning phenomenon: a droplet including a gate electrode material is deposited on the gate insulating film and then is dried. Alternatively, the gate electrodes may be formed by forming a conductive thin film by sputtering or the like and then patterning the thin film. Utilizing the pinning phenomenon, however, allows the gate electrode having a line width on the order of submicrons to be formed easily. The gate electrode can be patterned by a method of supplying an acidic droplet to dissolve the electrode and remove the electrode, or etching. In this case also, the removing step does not require removal precision on the order of submicrons. Thus, etching may employ a typical, inexpensive method rather than a high precision method.

Subsequently, an impurity element to serve as a donor or acceptor may be implanted utilizing the gate electrodes 76a and 76b as a mask, forming source/drain regions 78a to 78d. Next, an interlayer insulating film (not shown) is formed to cover the gate electrodes 76a and 76b, and the gate insulating film (not shown), and then contact holes are formed through the gate insulating film and interlayer insulating film. Thereafter, a conductive material is buried in the contact holes to form source/drain electrodes 80a to 80d. These steps can be implemented in the same manner as those in the first embodiment, and therefore the detailed description thereof will be omitted.

According to the method of the present embodiment, two semiconductor films applicable to a semiconductor element can be obtained through simple steps. Therefore, semiconductor devices of high density can be manufactured efficiently. In addition, since the gate electrodes are also fabricated by the pinning phenomenon, manufacturing steps are further simplified while semiconductor devices with a gate length of 1 μm or less can be obtained. Although two semiconductor films are formed in the present embodiment, three of more semiconductor films may be formed.

In the first to third embodiments, only one droplet including a semiconductor or gate electrode material is deposited and dried to obtain an annular thin film. Alternatively, plural droplets may be deposited.

Figure 8A:
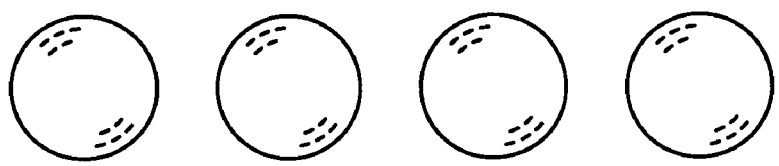
FIGS. 8A to 8D are explanatory diagrams of the semiconductor device according to the third illustrative embodiment.
Figure 8B:
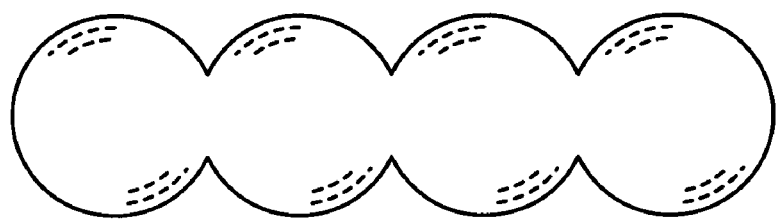
Figure 8C:
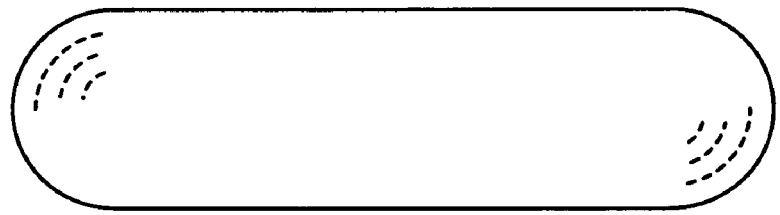
Figure 8D:
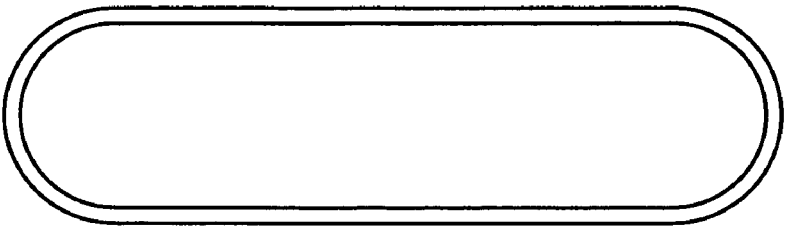

FIGS. 8A to 8D are explanatory diagrams for illustrating the case in which two or more droplets are deposited to form a thin film. If droplets including a semiconductor material are deposited at certain intervals as shown in FIG. 8A, the droplets spread to coalesce with each other as shown in FIG. 8B. As a result, the droplets become one line droplet as shown in FIG. 8C. Drying the line droplet causes the pinning phenomenon, and thus an annular thin film along the outer circumference of the line droplet can be obtained as shown in FIG. 8D. The linear semiconductor film 62 can be obtained thorough such a method. Note that if droplets are deposited so that part of the droplets overlaps with each other in the present embodiment, each droplet spreads and therefore two or more droplets coalesce with each other. Thus, since the shape of a droplet can be changed variously, the flexibility of shape of the obtained semiconductor film can also be enhanced. For example, by arranging plural droplets linearly to make them coalesce with each other, a line droplet can be obtained. If pinning is caused in the line droplet, the semiconductor material is precipitated at a peripheral edge of the droplet and thus a linear semiconductor film with a line width on the order of submicrons can be obtained. Instead of making all droplets coalesce with each other to form one large droplet, coalescence of at least two droplets and precipitation of a semiconductor film at a peripheral edge of the resulting droplet may be repeated for forming a linear semiconductor film.

Fourth Embodiment

FIGS. 9A to 9E and FIGS. 10A and 10B illustrate a method for manufacturing a thin film transistor according to a fourth embodiment of the invention. A thin film transistor to be manufactured according to the present embodiment is a top-gate thin film transistor T like that shown in FIG. 11B. The thin film transistor T includes a channel region 424 in a semiconductor film, source/drain regions 422 corresponding to the channel region 424, and a gate electrode 420 facing the channel region 424 with the intermediary of a gate insulating film 416.

Step for Forming a Semiconductor Film

Figure 9A:
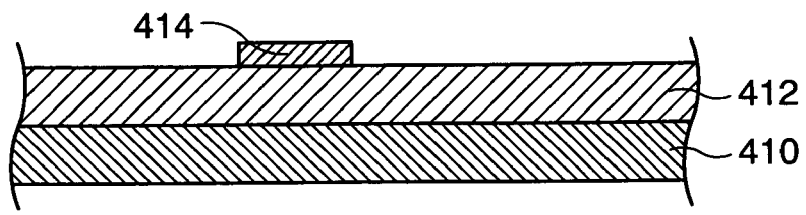
FIGS. 9A to 9E are explanatory diagrams of a semiconductor device according to a fourth illustrative embodiment of the invention.

FIG. 9A illustrates a state in which a semiconductor film 414 is formed on an insulating film 412 on a substrate 410. The insulating film 412 is formed on the substrate 410 made of an insulating material such as glass. In the present embodiment, a silicon oxide film is formed as the insulating film 412. The silicon oxide film can be deposited by PECVD, LPCVD, physical vapor deposition such as sputtering, or another deposition method. Alternatively, a coated insulating film (SOG film) may be deposited by using a liquid material.

In the present embodiment, a silicon film is formed as the semiconductor film 414. The silicon film is formed by CVD such as atmospheric pressure chemical vapor deposition (APCVD), LPCVD or PECVD, or by PVD such as sputtering or vapor deposition. Alternatively, the silicon film may be formed by the pinning phenomenon in a manner similar to the method for forming a gate electrode used in the above-described method for manufacturing a thin film transistor according to the present embodiment of the invention.

In the case of utilizing the pinning phenomenon, a droplet including a silicon film material is deposited so that the peripheral edge of the droplet is positioned on a region on which a silicon film needs to be formed. Plural droplets including a silicon film material may be deposited and then a silicon film may be precipitated at a peripheral edge of the droplet resulting from the coalescence of the plural droplets, depending on the shape of the silicon film. Furthermore, similarly with the method for forming a gate electrode according to an illustrative embodiment of the invention, the following steps may be implemented: a step for increasing the concentration of the silicon film material at the droplet periphery, a step for removing part of the formed silicon film, and a step for improving the crystallinity of the formed semiconductor film by supplying heat or light energy to the semiconductor film.

In the case of forming the silicon film by LPCVD, disilane ($Si_2H_6$) or the like is used as a raw material while a substrate is heated to about 400-700° C., for depositing silicon on the substrate. In PECVD, silicon can be deposited by using a monosilane ($SiH_4$) or the like as a raw material and heating a substrate to about 100-500° C. In sputtering, the substrate temperature is in the range of room temperature to about 400° C. The initial state of the silicon film thus deposited may be any of various states such as amorphous, mixed crystalline, microcrystalline and polycrystalline states. The thickness of the silicon film may be in the range of about 20-100 nm when the silicon film is used for a semiconductor film transistor. The deposited semiconductor film is provided with heat energy so as to be crystallized. In the present specification, the term "crystallization" encompasses not only crystallization of an amorphous semiconductor film but also improvement of the crystallinity of a polycrystalline or microcrystalline semiconductor film. The crystallization of a semiconductor film may employ, but is not limited to, laser irradiation or solid-phase growth.

The formed semiconductor film is patterned to a required shape by using photolithography and etching, to obtain the silicon film 414.

Step for Forming an Insulating Film

Figure 9B:
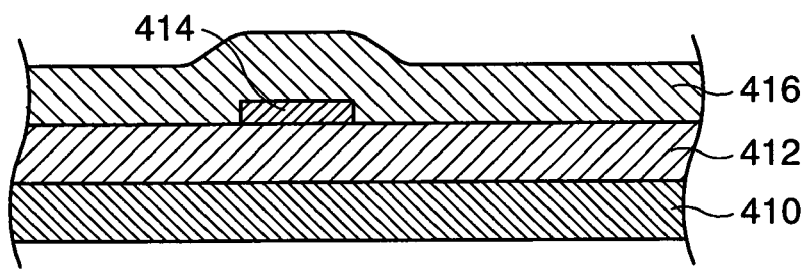
Figure 9C:
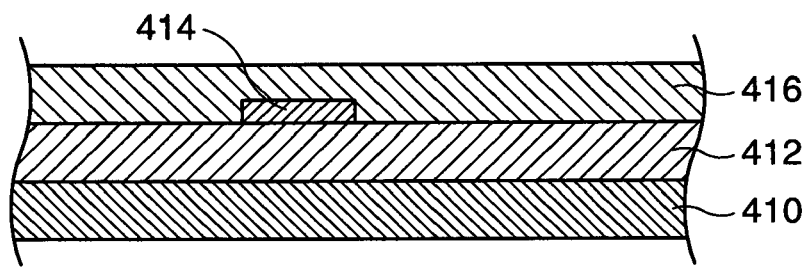

A step for forming the gate insulating film 416 will be described with reference to FIGS. 9B and 9C. The gate insulating film 416 is formed to cover the semiconductor film 414 and the insulating film 412, and is formed of, for example, a silicon oxide film. The silicon oxide film can be formed by a deposition method such as ECR-PECVD, PECVD, APCVD, or LPCVD. As shown in FIG. 9B, the gate insulating film 416 thus formed includes steps between a region deposited on the semiconductor film 414 and a region deposited on the insulating film 412. Thus, the surface of the gate insulating film 416 is not flat. If a droplet including a conductive material is supplied on the surface, the droplet does not spread uniformly. Therefore, the conductive material can not be precipitated to form the gate electrode at a desired position. In order to prevent this state, as shown in FIG. 9C, the gate insulating film 416 is planarized prior to the deposition of a droplet including a conductive material. CMP or etching can be used for the planarization.

The gate insulating film can also be formed by applying a liquid high-k or SOG material using a spin coater. In the case of applying a liquid material, the planarized surface can be obtained through a coating step and therefore planarization after forming the insulating film is not required. Also, a film may be deposited by spin coating on a gate insulating film formed by PECVD or the like. Depositing a film by spin coating allows the surface to be planarized.

Step for Depositing a Droplet

Figure 9D:
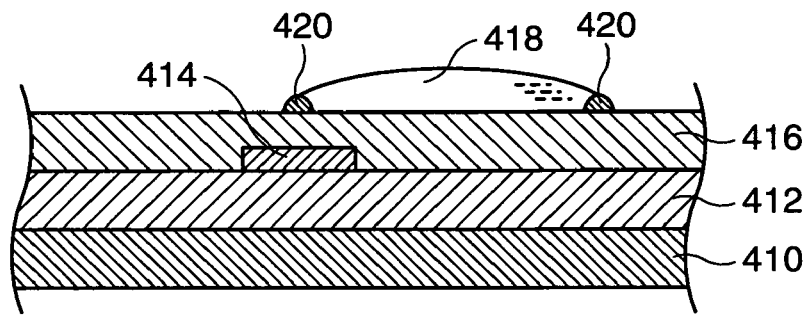

Subsequently, as shown in FIG. 9D, a droplet 418 including a conductive material is deposited on the insulating film 416. As the conductive material, for example, metal fine particles of Au, Ag, Cu, Ni or the like having a diameter of about several nanometers can be used. Ag colloid ink or the like is preferable, for example. The metal fine particles can be dispersed in an organic dispersion medium such as tetradecane and can be supplied as a droplet.

As a method for depositing the droplet 418 on the insulating film 416, there are methods employing a micro pipette, micro dispenser, ink jet and so forth. The ink jet method, which allows accurate patterning, is preferable. The ink jet method is conducted by using the above-described ink jet discharge device.

Figure 10A:
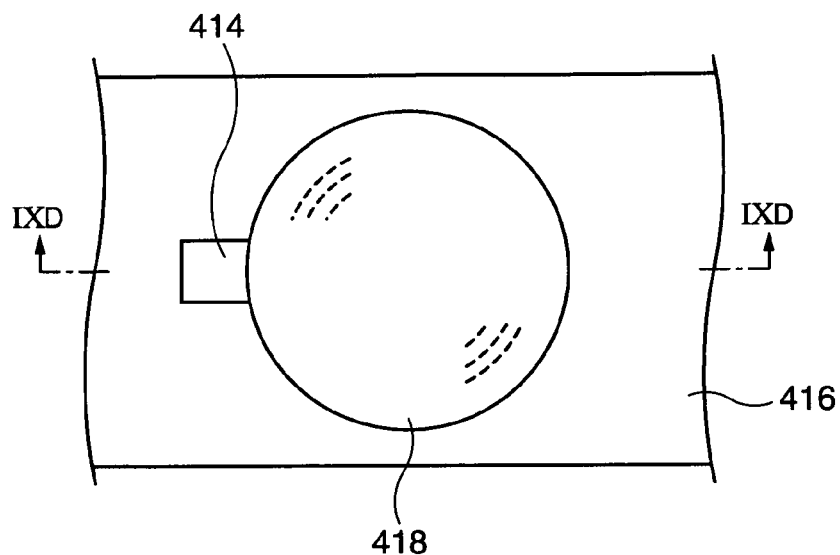
FIGS. 10A and 10B are explanatory diagrams of the semiconductor device according to the fourth illustrative embodiment.

FIG. 10A is a plan view illustrating the step for depositing a droplet. A sectional view along line IXD-IXD in FIG. 10A corresponds to FIG. 9D. In FIG. 10A, the illustration of the gate insulating film 416 is omitted in order to clearly show the positional relationship between the semiconductor film 414 and the droplet 418. The droplet 418 is deposited so that part of the arc of the outer circumference crosses near the center of the semiconductor 414 for allowing the peripheral edge to face the channel region.

When depositing a droplet, by controlling the wettability of the surface of the gate insulating film 416, the droplet is deposited so that the peripheral edge of the droplet 418 faces the channel region, that is, so that the peripheral edge of the droplet 418 crosses near the center of the semiconductor film 414. The wettability can be controlled by, for example, using a compound that has, at one end, a functional group for forming self-assembled monolayers (SAMs) on the surface of the gate insulating film, and a lyophobic functional group at the other end, to form a monomolecular film on the surface of the gate insulating film. Such a SAM film is formed on the gate insulating film except for a region on which a gate electrode is to be formed. Thereby, a droplet including a conductive material moves towards the part on which the SAM film is not formed, and is dried in the part, resulting in the precipitation of the conductive material.

Step for Precipitating a Conductive Material

The above-described "pinning phenomenon" is caused in the droplet 418 deposited on the insulating film 416, and thereby the annular conductive film 420 is formed along the outer periphery of the droplet.

Figure 9E:
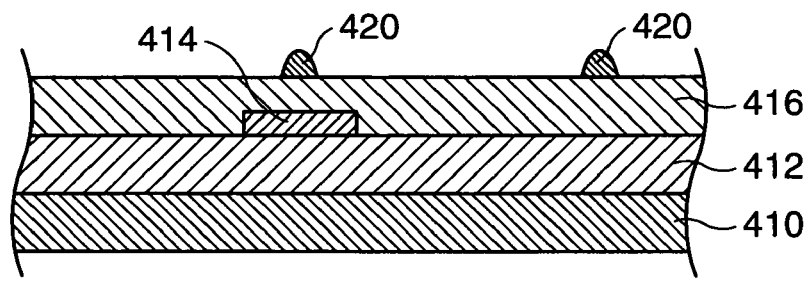
Figure 10B:
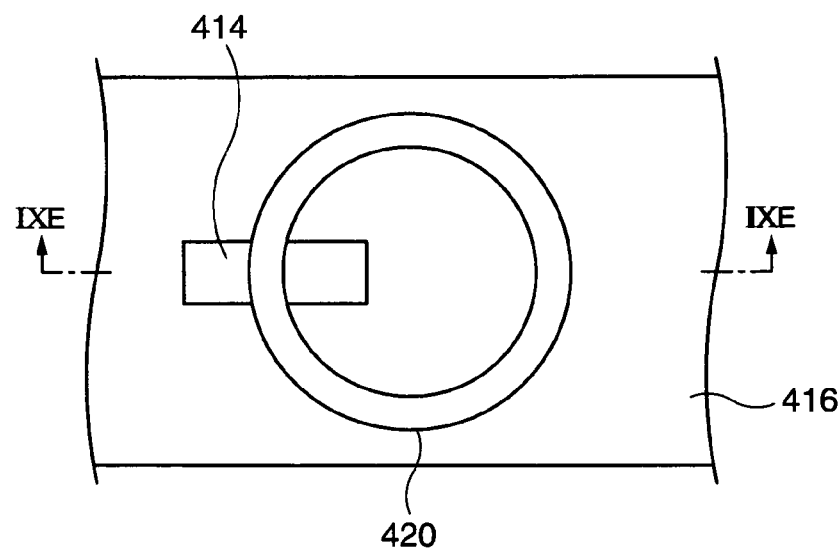

FIG. 9E illustrates a state in which the droplet has been completely dried and therefore the conductive material is precipitated along the periphery of the droplet, resulting in the formation of the annular conductive film 420. FIG. 10B is a plan view illustrating the step for precipitating a conductive material. A sectional view along line IXE-IXE in FIG. 10B corresponds to FIG. 9E. The conductive film 420 has an annular shape with a line width of 1 μm or less and is disposed to pass transversely across substantially the center of the semiconductor film 414.

During the drying of the droplet 418, control for increasing the concentration of the conductive material at the peripheral edge of the droplet may be implemented. For example, by adjusting the temperature of the substrate and discharging a droplet again on the conductive film that has been dried, the vaporization condition and viscosity of the droplet can be controlled. Thus, convection can be caused in the droplet, and effective movement of the conductive material towards the peripheral edge can occur. This control prevents the conductive material from remaining at the center of the droplet 418, thereby enabling the conductive material to be precipitated in an annular shape with a small line width. After the precipitation of the conductive material, heat treatment may be implemented for the obtained conductive thin film for aggregating the metal fine particles. Thereby, the conductivity of the thin film can be enhanced.

Step for Forming Source/Drain Regions

Figure 11A:
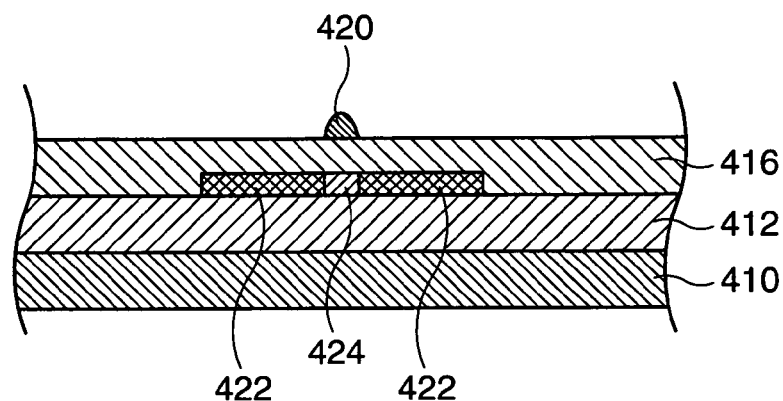
FIGS. 11A and 11B are explanatory diagrams of the semiconductor device according to the fourth illustrative embodiment.
Figure 11B:
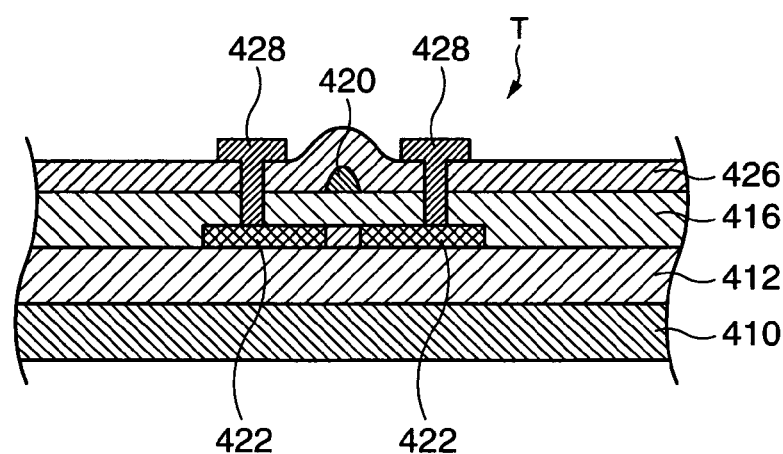

Then, as shown in FIG. 11A, an impurity element serving as a donor or acceptor may be implanted using the gate electrode 420 as a mask, namely so-called self-alignment ion implantation may be implemented. Thereby, the source/drain regions 422 and the active region 424 are formed in the semiconductor film 414. For example, phosphorous (P) is implanted as the impurity element, and thereafter the impurity element is activated by irradiating the semiconductor film with an XeCl excimer laser with the energy density of about 400 mJ/cm$^2$. Thereby, an N-type thin film transistor may be formed. Heat treatment at a temperature in the range of about 250-400° C. may be implemented for activating the impurity element instead of laser irradiation.

The gate electrode 420 with a line width under 1 μm can be formed as described above. Therefore, by utilizing the gate electrode as a mask for forming source/drain regions, a semiconductor element having a gate length on the order of submicrons can be obtained.

As described above, in the present embodiment, a conductive film having a predetermined shape with a line width on the order of submicrons can be formed through steps including: depositing liquid including a conductive material, and drying the liquid. Furthermore, the conductive film can be used as a gate electrode without patterning the conductive film. This configuration enables a high-performance and highly integrated semiconductor element having a very small gate length to be formed easily at lower cost.

[Droplet Discharge Device

The above-described droplet is formed by discharging liquid from an ink jet discharge device. Since the structures of the ink jet discharge device and ink jet head have been already described in the first embodiment referring to FIGS. 3 and 4, the description will be omitted here.

Fifth Embodiment

Figure 12:
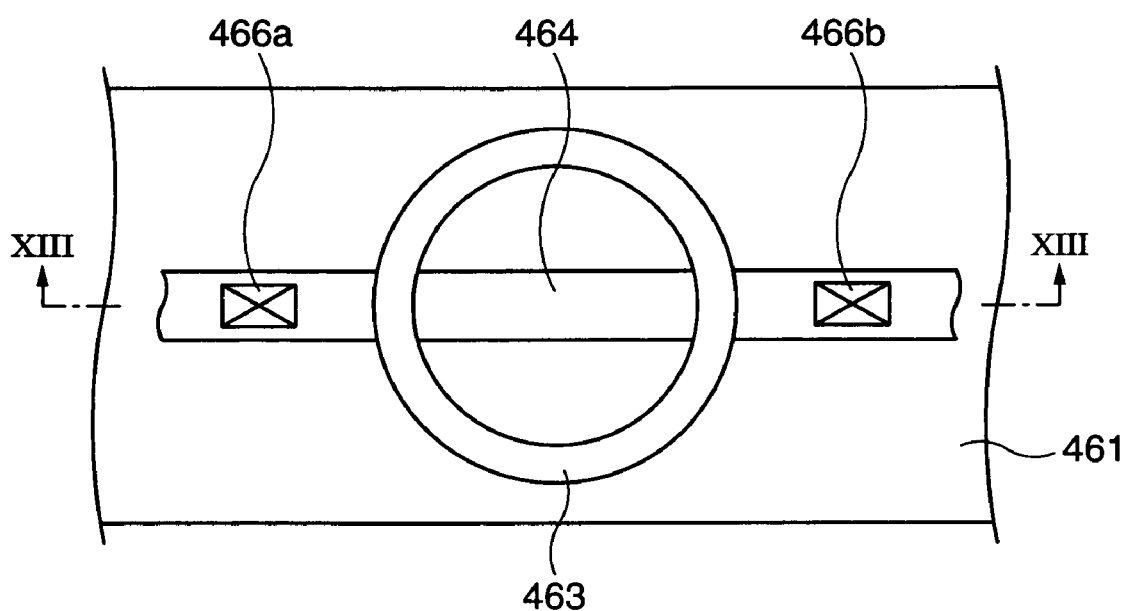
FIG. 12 is an explanatory diagram of a semiconductor device according to a fifth illustrative embodiment of the invention.
Figure 13:
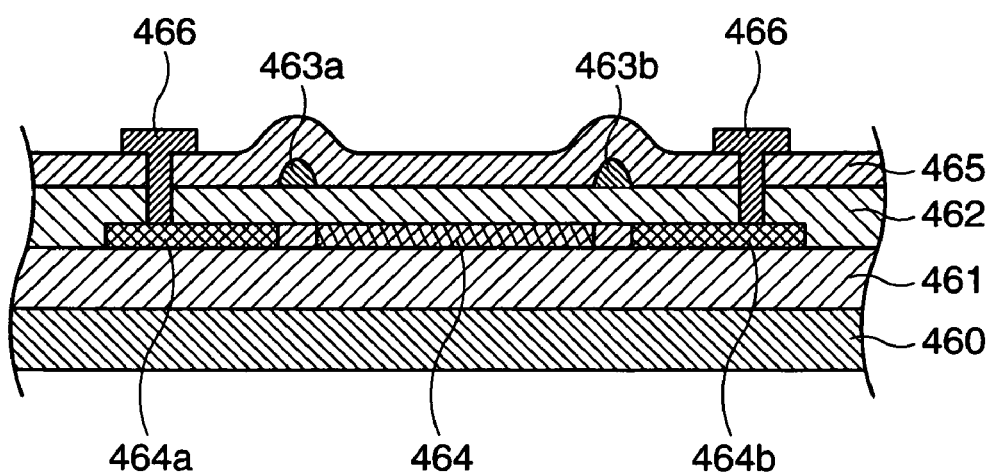
FIG. 13 is an explanatory diagram of the semiconductor device according to the fifth illustrative embodiment.

FIGS. 12 and 13 illustrate a thin film transistor according to a fifth embodiment of the invention. FIG. 13 is a sectional view along line XIII-XIII in FIG. 12.

Referring to FIG. 13, a thin film transistor according to the present embodiment is a so-called "double gate transistor" in which two gate electrodes 463a and 463b are formed between source/drain regions 464a and 464b. The transistor with such a structure has an advantage of involving low leakage current, and serves as one transistor. As is apparent from FIGS. 12 and 13, each of the gate electrodes 463a and 463b is part of one annular conductive thin film 463.

In the method for manufacturing a thin film transistor according to the above-described embodiments of the invention, such a semiconductor device can be formed by depositing a droplet including a conductive material so that the peripheral edge of the droplet is located at the position on which the gate electrode 463 is to be formed. Alternatively, in view of contraction of the droplet during the drying process, the droplet including a conductive material may be deposited to have a larger diameter than the distance between the positions on which the gate electrode 463 needs to be formed. For example, a droplet may be deposited to cover the semiconductor film 464 except for a region in which the source/drain regions 464a and 464b are to be formed.

According to the present embodiment, two gate electrodes can be formed at desired positions through simple and inexpensive steps: depositing one droplet including a conductive material, and drying the droplet. Since the gate electrode with a line width on the order of submicrons can be obtained, the subsequent patterning is not required and the gate capacitance of a semiconductor device can be decreased. The larger number of gates leads to a larger amount of supplied current, resulting in a corresponding higher performance. Also, the current amount per gate is reduced for the same total current amount, and thus current loss and heat generation can be suppressed.

Although the fifth embodiment has been described by taking as an example a double-gate transistor in which two gate electrodes are formed for one pair of drain/source regions, three or more gate electrodes may be formed for one pair of drain/source regions to fabricate a multi-gate transistor by using the method for forming a gate electrode according to illustrative embodiments of the invention. The invention also encompasses such a transistor.

Sixth Embodiment

Figure 14:
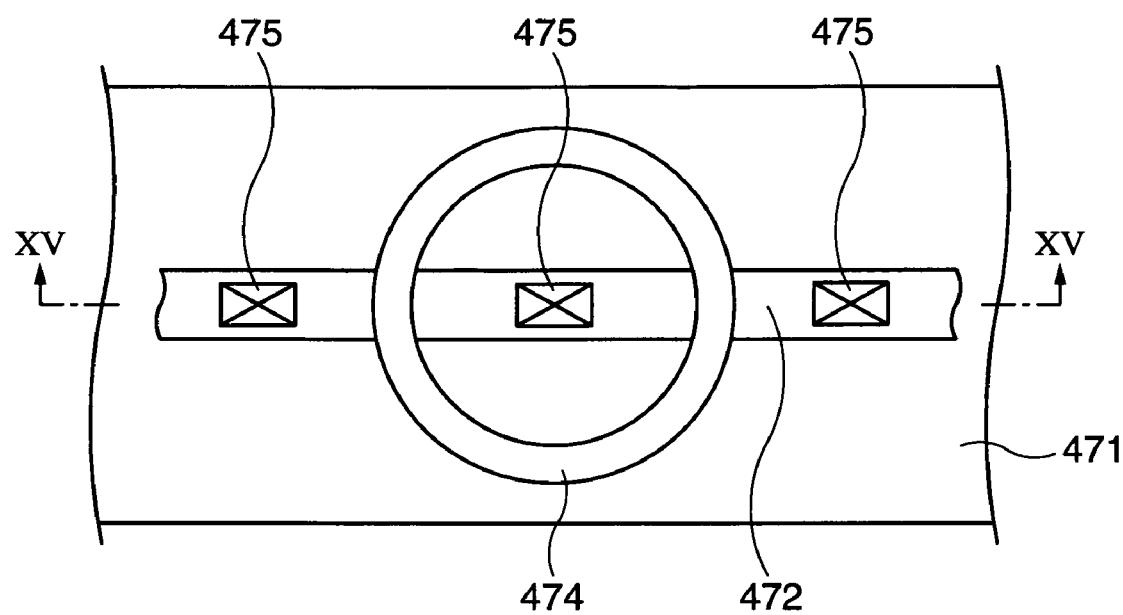
FIG. 14 is an explanatory diagram of a semiconductor device according to a sixth illustrative embodiment of the invention.
Figure 15:
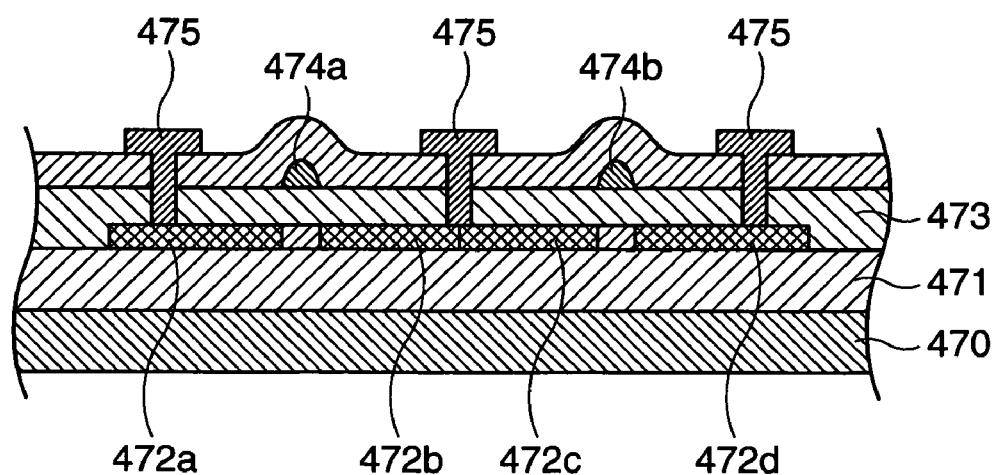
FIG. 15 is an explanatory diagram of the semiconductor device according to the sixth illustrative embodiment.

FIGS. 14 and 15 illustrate a semiconductor device according to a sixth embodiment of the invention. FIG. 15 is a sectional view along line XV-XV in FIG. 14.

The semiconductor device according to the present embodiment includes dual thin film transistors formed of two semiconductor elements. One semiconductor element has drain/source regions 472a and 472b, while the other semiconductor element has source/drain regions 472c and 472d. Gate electrodes 474a and 474b of the dual thin film transistors in FIG. 15 are each part of one annular conductive thin film 474 in FIG. 14. Such dual transistors can be equated with parallel-coupled two transistors, and serve as one transistor with a large gate width (channel width).

In the method for manufacturing a thin film transistor according to the above-described embodiments of the invention, such a semiconductor device can be formed by depositing a droplet including a conductive material so that the peripheral edge of the droplet is located at the positions on which the conductive thin film 474 needs to be formed, namely at the positions facing the channel regions. Alternatively, in view of contraction of the droplet during the drying process, the droplet including a conductive material may be deposited to have a larger diameter than the distance between the positions on which the gate electrode 474 needs to be formed. For example, a droplet may be deposited to cover the semiconductor film 472 except for a region in which the drain regions 472a and 472d are to be formed.

According to the present embodiment, two gate electrodes used for dual thin film transistors can be formed at desired positions through simple and inexpensive steps: depositing one droplet including a conductive material, and drying the droplet. Since the gate electrode with a line width on the order of submicrons can be obtained, the subsequent patterning is not required and the gate capacitance of a semiconductor device is small. Since dual thin film transistors can be formed easily, further miniaturized semiconductor elements of higher density can be obtained easily.

Seventh Embodiment

Figure 16:
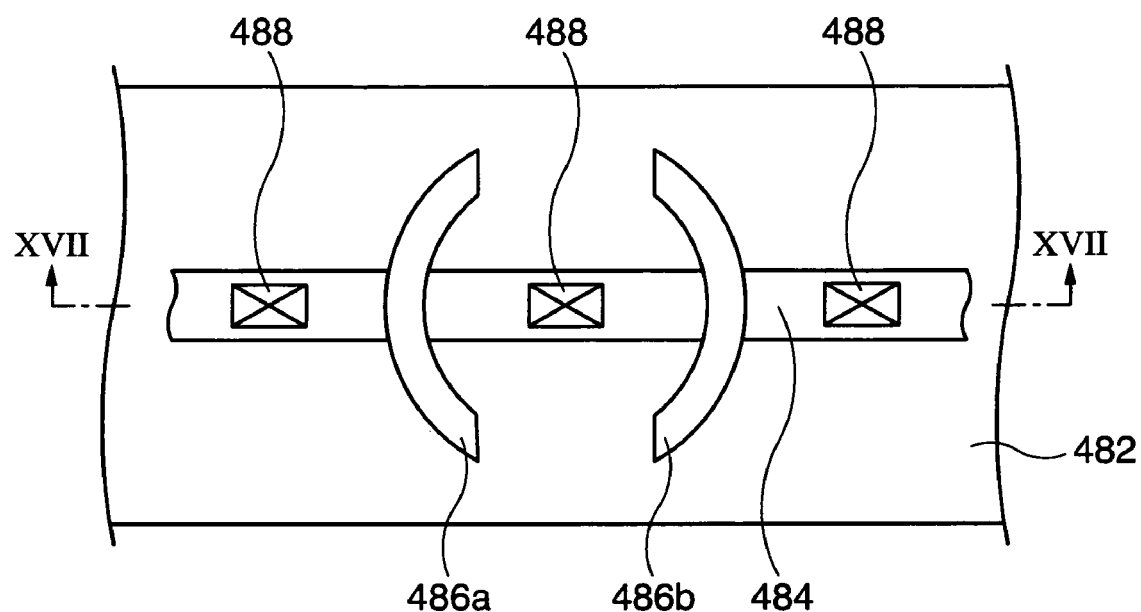
FIG. 16 is an explanatory diagram of a semiconductor device according to a seventh illustrative embodiment of the invention.
Figure 17:
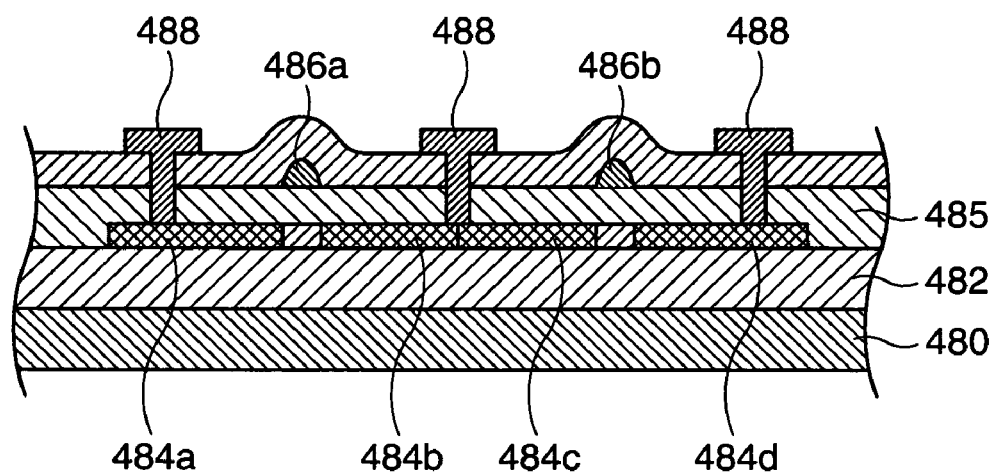
FIG. 17 is an explanatory diagram of the semiconductor device according to the seventh illustrative embodiment.

FIGS. 16 and 17 illustrate a semiconductor device according to a seventh embodiment of the invention. FIG. 17 is a sectional view along line XVII-XVII in FIG. 16.

The semiconductor device according to the present embodiment includes dual thin film transistors formed of two semiconductor elements: a semiconductor element having drain/source regions 484a and 484b, and a semiconductor element having source/drain regions 484c and 484d. Gate electrodes 486a and 486b of the dual thin film transistors in FIG. 17 can be formed by removing part of one annular conductive thin film as shown in FIG. 16. Such dual transistors can be equated with two transistors that operate differently and have a common source.

In the method for manufacturing a thin film transistor according to the above-described embodiments of the invention, such a semiconductor device can be formed by depositing a droplet including a conductive material so that the outer circumference of the droplet is located at the positions on which the conductive thin films 486a and 486b need to be formed. Alternatively, in view of contraction of the droplet during the drying process, the droplet including a conductive material may be deposited to have a diameter larger than the diameter of a ring including the conductive thin films 486a and 486b. For example, a droplet may be deposited to cover the semiconductor film 484 except for a region in which the drain regions 484a and 484d are to be formed. After the conductive material has been precipitated through the drying step, the thin film not serving as the gate electrode is removed to obtain the gate electrodes 486a and 486b. The following methods can be used for removing the thin film: a method of supplying an acid solution such as a hydrochloric acid or sulfuric acid to remove the unnecessary conductive thin film with the acid solution, a method of lifting off a silicon oxide film with a hydrofluoric acid, or etching. The area of the regions from which the thin film is to be removed is not on the order of submicrons, and therefore typical etching can be used.

According to the present embodiment, two gate electrodes used for dual thin film transistors can be formed at desired positions through simple and inexpensive steps: depositing one droplet including a conductive material, and drying the droplet. Since the gate electrode with a line width on the order of submicrons can be obtained, the subsequent patterning is not required and the gate capacitance of a semiconductor device can be decreased. Since dual thin film transistors can be formed easily, further miniaturized semiconductor elements of higher density can be obtained easily.

Eighth Embodiment

Figure 18:
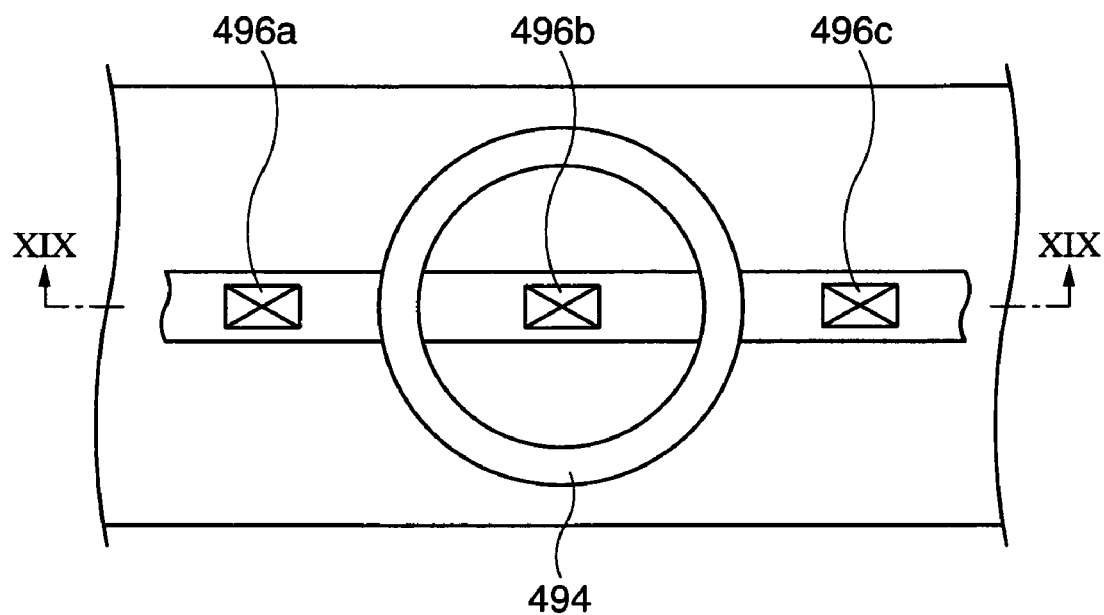
FIG. 18 is an explanatory diagram of a semiconductor device according to an eighth illustrative embodiment of the invention.
Figure 19:
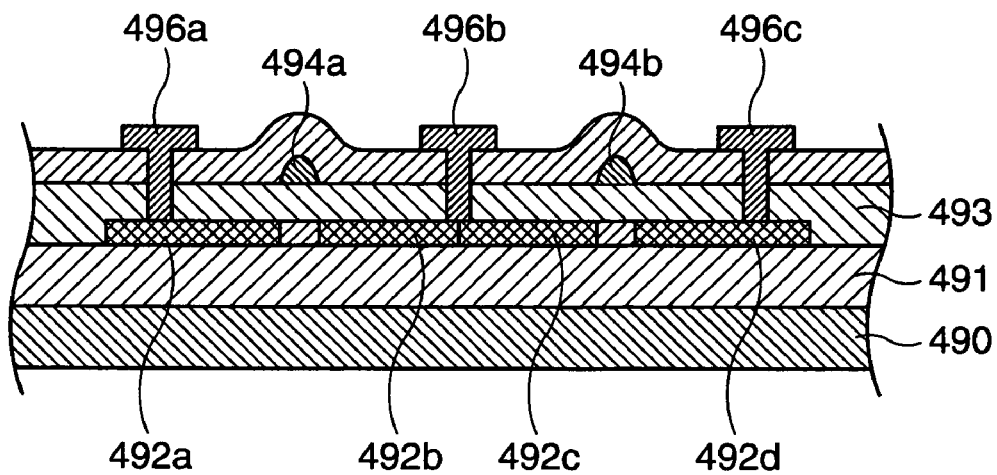
FIG. 19 is an explanatory diagram of the semiconductor device according to the eighth illustrative embodiment.

FIGS. 18 and 19 illustrate a semiconductor device according to an eighth embodiment of the invention. FIG. 19 is a sectional view along line XIX-XIX in FIG. 18.

Referring to FIG. 19, the semiconductor device according to the present embodiment is a complementary MOS semiconductor device including an N-channel MOS transistor $T_N$ and a P-channel MOS transistor $T_P$. Drain/source regions (492a/492b) and source/drain regions (492c/492d) have a conductivity type different from each other. An electrode 496b is electrically coupled to both $P^+$ and $N^+$ regions.

As shown in FIG. 18, gate electrodes 494a and 494b of the N-channel and P-channel MOS transistors are each part of one annular conductive thin film 494.

In forming the gate electrode in the fabrication process for a complementary MOS semiconductor device, such a semiconductor device can be obtained by depositing a droplet that includes a conductive material so that the peripheral edge of the droplet is located at the positions on which the gate electrodes of the N-channel and P-channel MOS transistors $T_N$ and $T_P$ need to be formed, and then drying the droplet to precipitate the conductive material.

According to the present embodiment, the gate electrodes of the both transistors can be formed through simple steps of depositing one droplet and drying it. Since the gate electrode with a line width on the order of submicrons can be obtained, the subsequent patterning is not required and the gate capacitance of a semiconductor device can be decreased.

Ninth Embodiment

FIGS. 20A to 20E and FIGS. 21A and 21B illustrate a method for manufacturing a gate electrode according to a ninth embodiment of the invention. In the present embodiment, a method will be described in which a multi-channel thin film transistor including two thin film transistors is manufactured by using the method for manufacturing a thin film transistor according to illustrative embodiments of the invention.

Step for Forming a Semiconductor Film

Figure 20A:
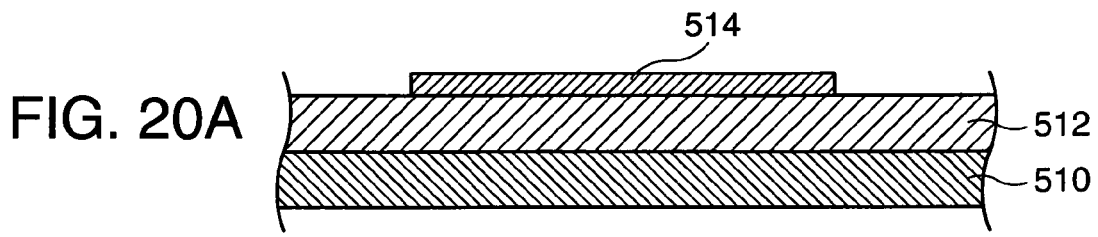
FIGS. 20A to 20E are explanatory diagrams of a method for manufacturing a semiconductor device according to a ninth illustrative embodiment of the invention.

FIG. 20A illustrates a state in which a semiconductor film 514 is formed on an insulating film 512 on a substrate 510. The insulating film 512 is formed on the substrate 510 made of an insulating material such as glass. In the present embodiment, a silicon oxide film is formed as the insulating film 512. The silicon oxide film can be deposited by PECVD, LPCVD, physical vapor deposition such as sputtering, an SOG method, or another deposition method.

In the present embodiment, a silicon film is formed as the semiconductor film 514. The silicon film is formed by CVD such as APCVD, LPCVD or PECVD, or by PVD such as sputtering or vapor deposition. In the case of forming the silicon film by LPCVD, monosilane ($SiH_4$), disilane ($Si_2H_6$) or the like is used as a raw material while a substrate is heated to about 400-700° C., for depositing silicon on the substrate. In PECVD, silicon can be deposited by using a monosilane ($SiH_4$) or the like as a raw material and heating a substrate to about 100-500° C. In sputtering, the substrate temperature is in the range of room temperature to about 400° C. The initial state of the silicon film thus deposited may be any of various states such as amorphous, mixed crystalline, microcrystalline and polycrystalline states. The thickness of the silicon film may be in the range of about 20-100 nm when the silicon film is used for a semiconductor film transistor. The deposited semiconductor film is provided with heat energy so as to be crystallized. In the present specification, the term "crystallization" encompasses not only crystallization of an amorphous semiconductor film but also improvement of the crystallinity of a polycrystalline or microcrystalline semiconductor film. The crystallization of a semiconductor film may employ, but is not limited to, laser irradiation or solid-phase growth.

The formed semiconductor film is patterned to a required shape by using photolithography and etching, to obtain the silicon film 514.

Step for Forming an Insulating Film

Figure 20B:
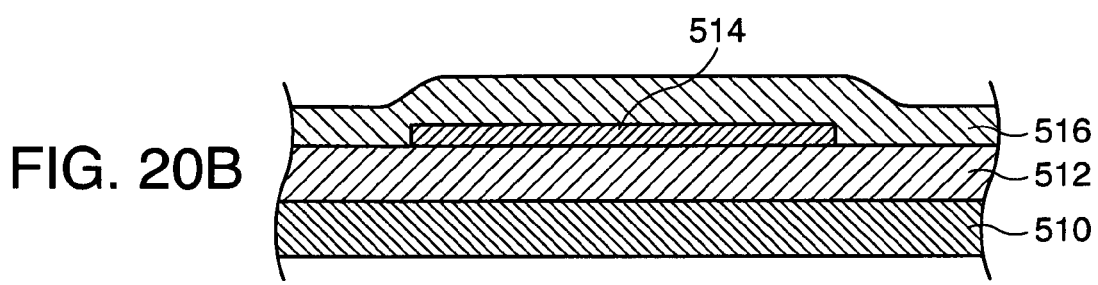
Figure 20C:
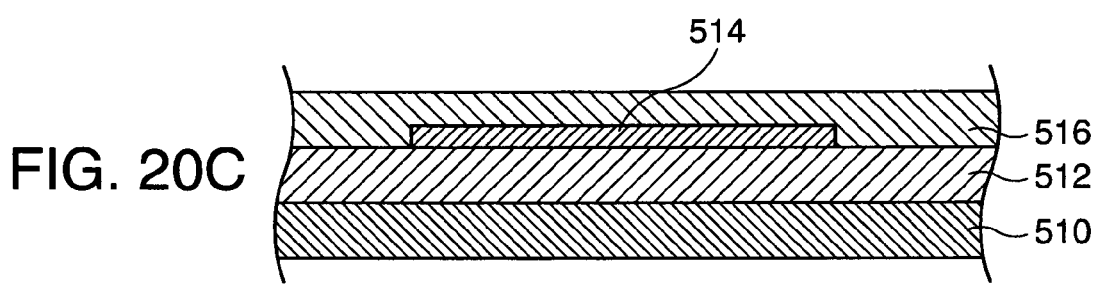

A step for forming a gate insulating film 516 will be described with reference to FIGS. 20B and 20C. The gate insulating film 516 is formed to cover the semiconductor film 514 and the insulating film 512, and is formed of, for example, a silicon oxide film. The silicon oxide film can be formed by a deposition method such as ECR-PECVD, PECVD, APCVD, or LPCVD. As shown in FIG. 20B, the gate insulating film 516 thus formed includes steps between a region deposited on the semiconductor film 514 and a region deposited on the insulating film 512. Thus, the surface of the gate insulating film 516 is not flat. If a droplet including a conductive material is supplied on the surface, the droplet does not spread uniformly. Therefore, the conductive material can not be precipitated to form the gate electrode at a desired position. In order to prevent this state, as shown in FIG. 20C, the gate insulating film 516 is planarized prior to the deposition of a droplet including a conductive material. CMP or etching can be used for the planarization.

The gate insulating film can also be formed by applying a liquid SOG or low-k material using a spin coater. In the case of applying a liquid material, a flat surface can be formed even if the underlying layer has patterns and steps. Therefore, planarization after forming the insulating film is not required.

Step for Depositing a Droplet

Figure 20D:
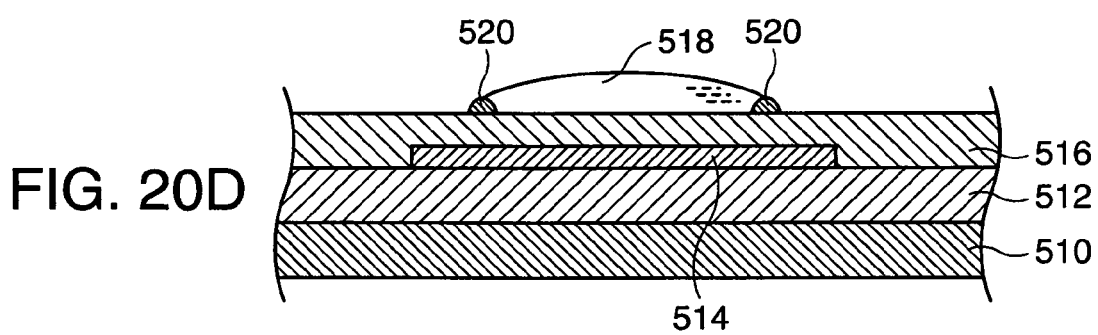

Subsequently, as shown in FIG. 20D, a droplet 518 including a conductive material is deposited on the insulating film 516. As the conductive material, for example, metal fine particles of Au, Ag, Cu or the like having a diameter of about several nanometers can be used. Ag colloid ink or the like is preferable, for example. The metal fine particles can be dispersed in an organic dispersion medium such as tetradecane and can be supplied as a droplet.

As a method for depositing the droplet 518 on the insulating film 516, there are methods employing a micro pipette, micro dispenser, ink jet and so forth. The ink jet method, which allows accurate patterning, is preferable. The ink jet method is conducted by using the above-described ink jet discharge device.

Figure 21A:
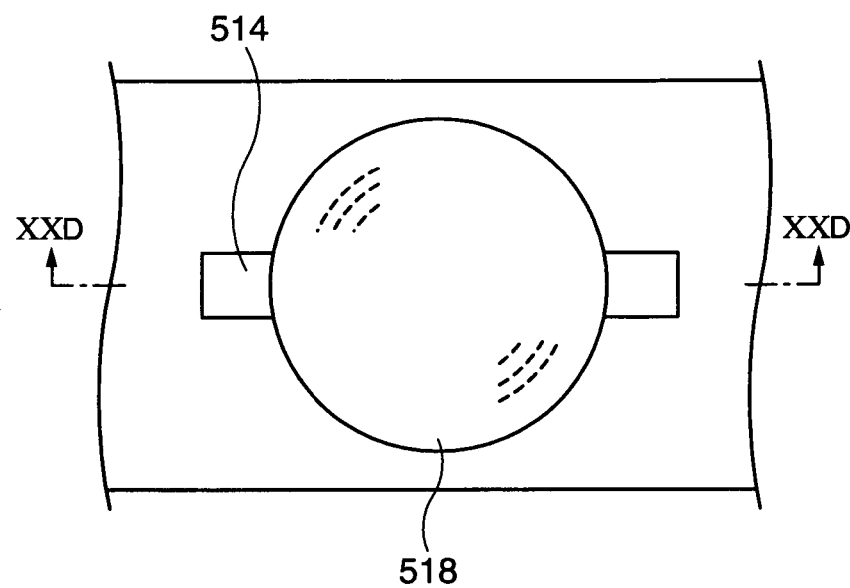
FIGS. 21A and 21B are explanatory diagrams of the method for manufacturing a semiconductor device according to the ninth illustrative embodiment.

FIG. 21A is a plan view illustrating the step for depositing a droplet. A sectional view along line XXD-XXD in FIG. 21A corresponds to FIG. 20D. In FIG. 21A, the illustration of the gate insulating film 516 is omitted in order to clearly show the positional relationship between the semiconductor film 514 and the droplet 518.

In the present embodiment, two thin film transistors are formed by using the semiconductor film 514 while the gate electrodes of two thin film transistors are coupled to each other. Therefore, the droplet 518 is deposited so that the peripheral edge of the droplet 518 passes transversely across the semiconductor film 514 at two positions. More specifically, the droplet 518 is deposited so that the diameter of the deposited droplet 518 is the same as the distance between the positions on which the gate electrodes of two thin film transistors need to be formed. Alternatively, in view of contraction of the droplet during the drying process, a droplet is deposited to have a diameter slightly larger than the distance.

Step for Precipitating a Conductive Material

The above-described "pinning phenomenon" is caused in the droplet 518 deposited on the insulating film 516, and thereby an annular conductive film 520 is formed along the outer periphery of the droplet 518.

Figure 20E:
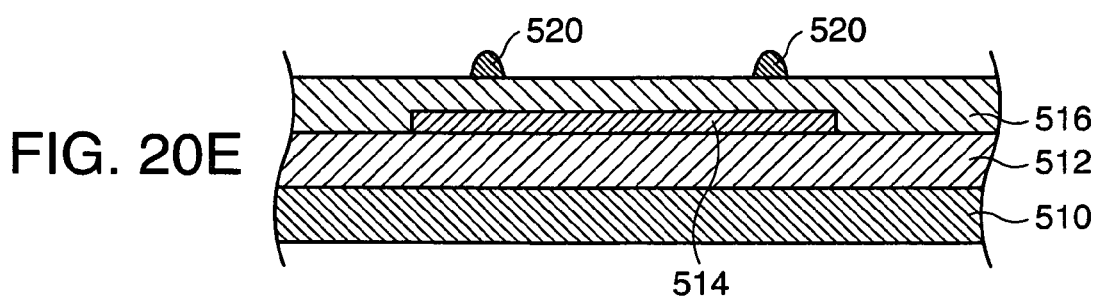
Figure 21B:
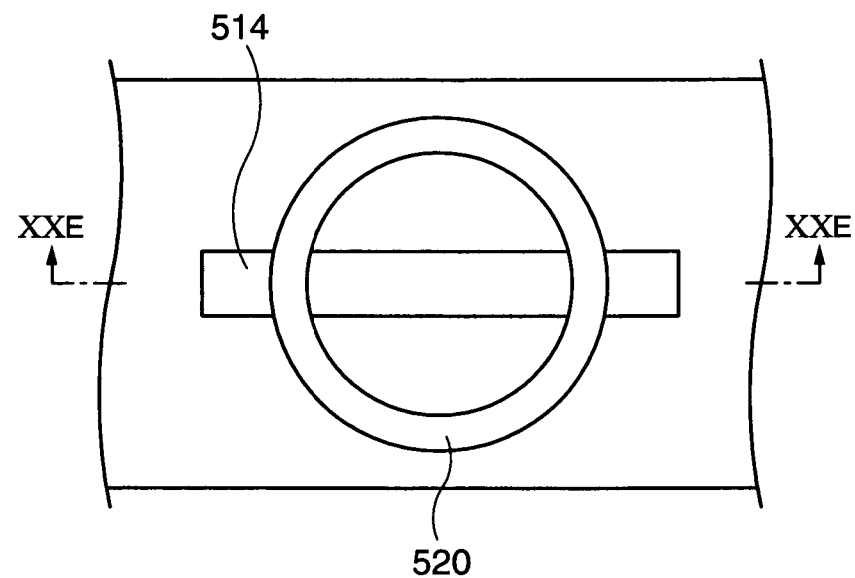

FIG. 20E illustrates a state in which the droplet has been completely dried and therefore the conductive material is precipitated along the shape of the droplet, resulting in the formation of the annular conductive film 520. FIG. 21B is a plan view illustrating the step for precipitating a conductive material. A sectional view along line XXE-XXE in FIG. 21B corresponds to FIG. 20E. The conductive film 520 has an annular shape with a line width of 1 μm or less and is disposed to pass transversely across the semiconductor film 514 at two positions.

During the drying of the droplet 518, the concentration of the conductive material at the peripheral edge of the droplet may be controlled. For example, by adjusting the temperature of the substrate and discharging a droplet again on the conductive film that has been dried, the vaporization condition and viscosity of the droplet can be controlled. Thus, convection can be caused in the droplet, and effective movement of the conductive material towards the peripheral edge can occur. This control prevents the conductive material from remaining at the center of the droplet 518, thereby enabling the conductive material to be precipitated in an annular shape with a small line width. After the precipitation of the conductive material, heat treatment may be implemented for the obtained conductive thin film for aggregating the metal fine particles. Thereby, the conductivity of the thin film can be enhanced.

Step for Forming Source/Drain Regions

Figure 22A:
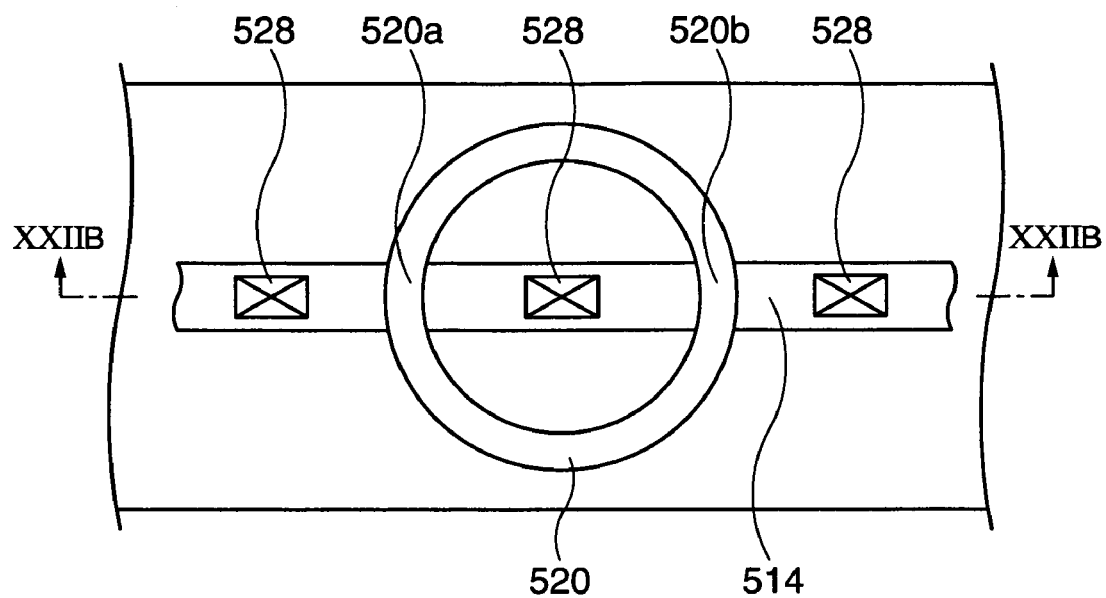
FIGS. 22A and 22B are explanatory diagrams of the method for manufacturing a semiconductor device according to the ninth illustrative embodiment.

Subsequently, as shown in FIG. 22A, an impurity element serving as a donor or acceptor may be implanted utilizing regions 520a and 520b of the gate electrode 520 as a mask, namely so-called self-alignment ion implantation is implemented.

For example, phosphorous (P) is implanted as the impurity element, and thereafter the impurity element is activated by irradiating the semiconductor film with an XeCl excimer laser with the energy density of about 400 mJ/cm$^2$. Thereby, an N-type thin film transistor is formed. Heat treatment at a temperature in the range of about 250-400° C. may be implemented for activating the impurity element instead of laser irradiation.

Implanting an impurity element using the regions 520a and 520b as a mask results in the formation of regions 514a, 514b and 514c. The region 514a serves as the drain region of the thin film transistor including the gate electrode 520a, while the region 514c serves as the drain region of the thin film transistor including the gate electrode 520b. Also, the region 514b serves as the source region of the thin film transistor including the gate electrode 520a and the thin film transistor including the gate electrode 520b.

Figure 22B:
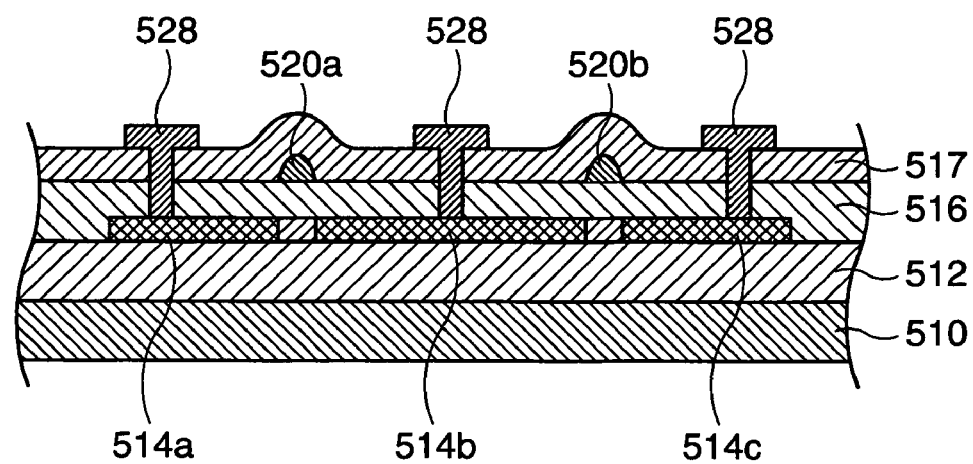

Then, as shown in FIG. 22B, an insulating film 517 is formed over the gate insulating film 516 and the gate electrodes 520a and 520b. For example, a silicon oxide film with the thickness of about 500 nm is formed by PECVD. Next, contact holes reaching the source region 514b and the drain regions 514a and 514c are formed in the insulating films 516 and 517. Then, source/drain electrodes 528 are formed in the contact holes and on the peripheral parts of the contact holes on the insulating film 517. The source/drain electrodes 528 are formed by, for example, depositing aluminum by sputtering. Also, contact holes to the gate electrodes 520a and 520b are formed in the insulating film 517 and terminal electrodes (not shown) for the gate electrodes are formed.

In two thin film transistors formed as described above, the gate electrodes 520a and 520b are each part of one annular conductive thin film 520. Such transistors serve as two transistors sharing the source region and gate electrode.

In the present embodiment, such two transistors can be manufactured through simple and inexpensive steps: depositing one droplet including a conductive material, and drying the droplet. Since the gate electrode 520 obtained through the present method can have a line width under 1 μm, the subsequent patterning is not required. In addition, a semiconductor element having a gate length on the order of submicrons can be obtained by forming source/drain regions using the gate electrode as a mask. Thus, a high performance thin film transistor with a small gate capacitance can be fabricated. The method of the present embodiment allows further miniaturized semiconductor elements of higher density to be easily obtained.

Droplet Discharge Device

The above-described droplet is formed by discharging liquid from an ink jet discharge device. Since the structures of the ink jet discharge device and ink jet head have been already described in the first embodiment referring to FIGS. 3 and 4, the description will be omitted here.

Tenth Embodiment

Figure 23A:
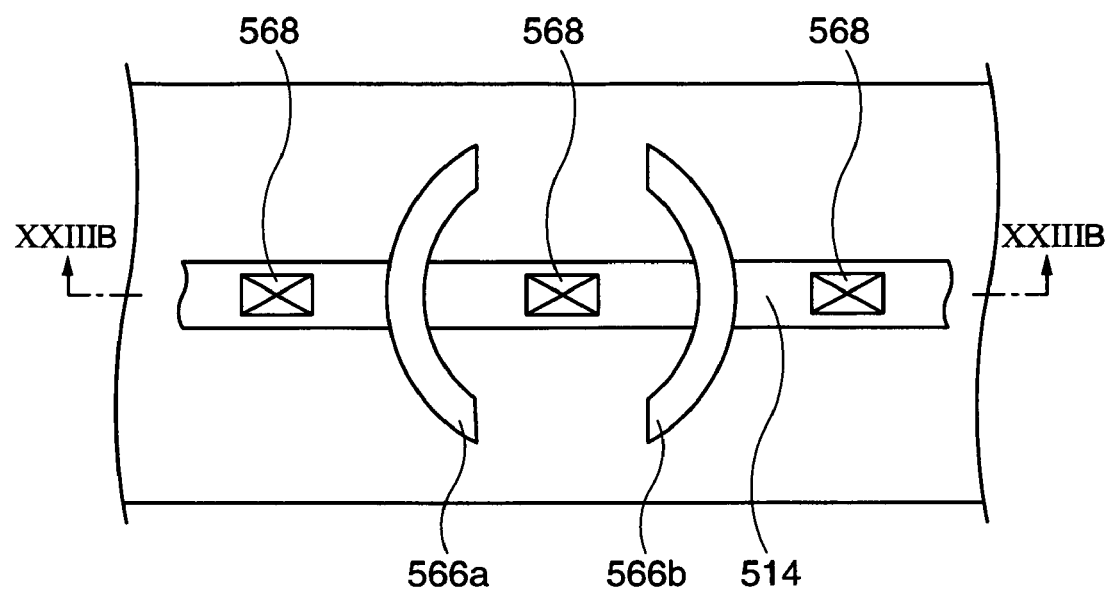
FIGS. 23A and 23B are explanatory diagrams of a semiconductor device according to a tenth illustrative embodiment of the invention.
Figure 23B:
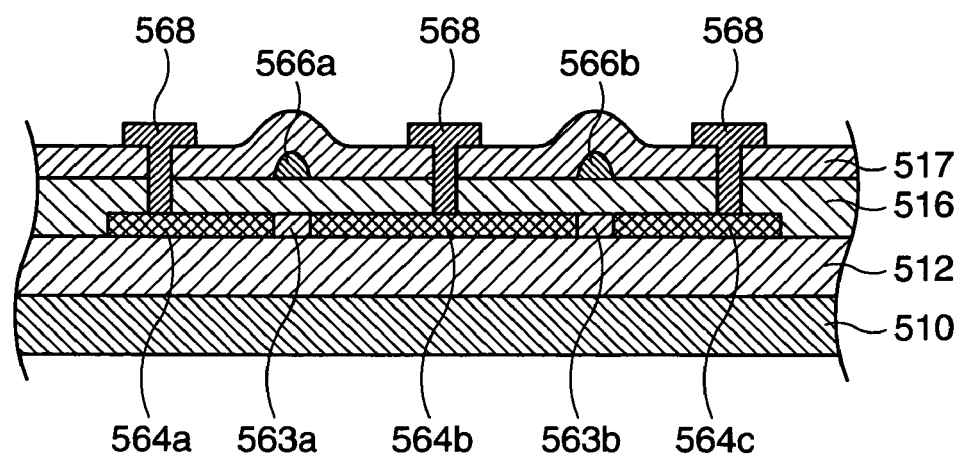

FIGS. 23A and 23B illustrate a semiconductor device according to a tenth embodiment of the invention. In the present embodiment, dual thin film transistors are manufactured by using the method for manufacturing a thin film transistor according to illustrative embodiments of the invention. Here, the term dual thin film transistors refers to two thin film transistors coupled in series. FIG. 23B is a sectional view along line XXIIIB-XXIIIB in FIG. 23A.

In the manufacturing method of the present embodiment, steps for forming a semiconductor film, for forming an insulating film, for depositing a droplet, and for precipitating a conductive material can be implemented through the same method as or based on the first embodiment. Therefore, the detailed description of the steps will be omitted.

Step for Separating a Gate Electrode

In the present embodiment, after precipitating a conductive thin film in an annular shape on the insulating film utilizing the pinning phenomenon, part of the thin film is removed to separate the thin film into gate electrodes each facing the respective channel regions of the dual thin film transistors. FIG. 23A is a plan view illustrating a state in which the thin film is separated. As shown in FIG. 23A, gate electrodes 566a and 566b facing channel regions 563a and 563b of the dual thin film transistors, respectively, have a shape of islands isolated from each other.

The following methods can be used for removing the thin film: a method of supplying an acid solution such as a hydrochloric acid or sulfuric acid to remove the unnecessary conductive thin film with the acid solution, a method of lifting off a silicon oxide film with a hydrofluoric acid, or etching. The area of the regions from which the thin film is to be removed is not on the order of submicrons, and therefore typical etching can be used.

Step for Forming Source/Drain Regions

Subsequently, as shown in FIG. 23A, an impurity element serving as a donor or acceptor is implanted utilizing the gate electrodes 566a and 566b as a mask, namely so-called self-alignment ion implantation is implemented.

For example, phosphorous (P) is implanted as the impurity element, and thereafter the impurity element is activated by irradiating the semiconductor film with an XeCl excimer laser with the energy density of about 400 mJ/cm$^2$. Thereby, an N-type thin film transistor is formed. Heat treatment at a temperature in the range of about 250-400° C. may be implemented for activating the impurity element instead of laser irradiation.

Implanting an impurity element using the gate electrodes 566a and 566b as a mask results in the formation of regions 564a, 564b and 564c. The region 564a serves as the source region of the thin film transistor including the gate electrode 566a. The region 564b serves as the drain region of the thin film transistor including the gate electrode 566a and also serves as the source region of the thin film transistor including the gate electrode 566b. The region 564c serves as the drain region of the thin film transistor including the gate electrode 566b.

Then, as shown in FIG. 23B, the insulating film 517 is formed over the gate insulating film 516 and the gate electrodes 566a and 566b. For example, a silicon oxide film with the thickness of about 500 nm is formed by PECVD. Next, contact holes reaching the regions 564a, 564b and 564c are formed in the insulating films 516 and 517. Then, source/drain electrodes 568 are formed in the contact holes and on the peripheral parts of the contact holes on the insulating film 517. The source/drain electrodes 568 are formed by, for example, depositing aluminum by sputtering. Also, contact holes to the gate electrodes 566a and 566b are formed in the insulating film 517 and terminal electrodes (not shown) for the gate electrodes are formed.

According to the present embodiment, two gate electrodes that have a shape of islands isolated from each other and are used for dual thin film transistors can be formed at desired positions through simple and inexpensive steps: depositing one droplet including a conductive material, and drying the droplet. Since the gate electrode with a line width on the order of submicrons can be obtained, the subsequent patterning is not required and the gate capacitance of a semiconductor device can be decreased. Since dual thin film transistors can be formed easily, further miniaturized semiconductor elements of higher density can be obtained easily.

Eleventh Embodiment

Figure 24:
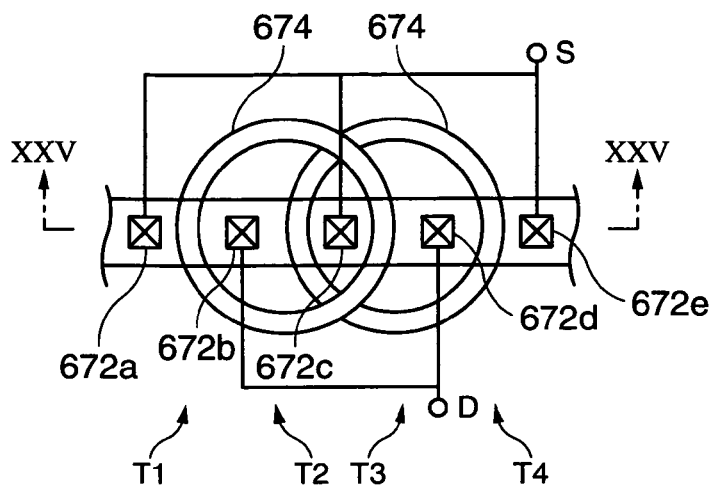
FIG. 24 is an explanatory diagram of a semiconductor device according to an eleventh illustrative embodiment of the invention.
Figure 25:
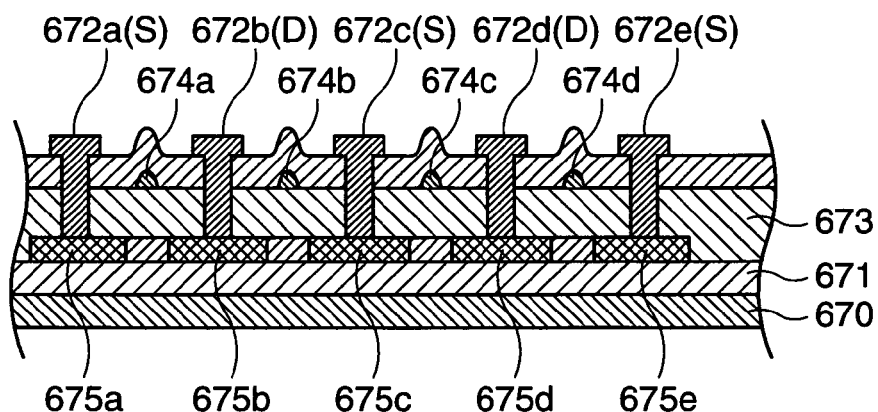
FIG. 25 is an explanatory diagram of the semiconductor device according to the eleventh illustrative embodiment.
Figure 26:
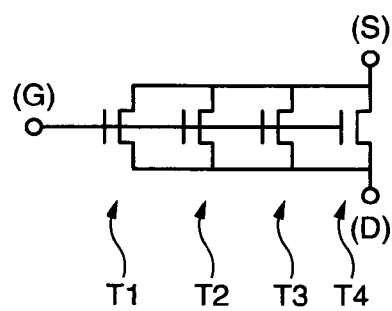
FIG. 26 is an equivalent circuit diagram of the semiconductor device according to the eleventh illustrative embodiment.

FIG. 24 illustrates a semiconductor device according to an eleventh embodiment of the present invention. FIG. 25 is a sectional view of the semiconductor device along line XXV-XXV in FIG. 24. Also, FIG. 26 is an equivalent circuit diagram of the semiconductor device according to the present embodiment. The semiconductor device according to the present embodiment includes four thin film transistors T1 to T4. Source electrodes 672a, 672c and 672e and drain electrodes 672b and 672d of the thin film transistors T1 to T4 are common electrodes (refer to FIGS. 24 and 26). Meanwhile, as shown in FIG. 24, gate electrodes 674a to 674d in the thin film transistors T1 to T4 are part of two annular conductive thin films formed partly overlapping each other. Such a transistor is a multi-channel transistor in which channels are coupled in parallel, and which serves as one transistor with a large channel width. The semiconductor device having such a structure is formed as follows.

As described above, first, a semiconductor film 675 to serve as a semiconductor layer is formed on an insulating film 671 on a substrate 670 by using CVD, PVD or the like (refer to FIG. 25). A plurality of channel regions will be formed in the semiconductor layer later. A gate insulating film 673 that is made up of an SOG film and therefore has a flat surface is formed to cover the semiconductor film 675 formed as above and the insulating film 671. Then, droplets including a conductive material are sequentially dropped on the gate insulating film 673 by using an ink jet discharge device (refer to FIG. 4) to form a plurality of annular conductive thin films (conductive patterns) 674. Specifically, a first droplet including a conductive material is dropped so that part of the peripheral edge of the droplet faces each channel region (region between source and drain regions). The drying rate of the droplet at the peripheral edge is larger than at the center part. Therefore, a flow from the center part of the droplet towards the peripheral edge is caused, inducing the conductive material to be moved towards the peripheral edge. As a result, the annular conductive thin film 674 is formed along the outer periphery of the first droplet (for example, the left annular conductive thin film in FIG. 24).

After the annular conductive thin film 674 corresponding to the first droplet is formed, a second droplet is dropped so that the droplet includes part of the annular conductive thin film 674 (in other words, so that part of the droplets overlap with each other), and so that the part of the peripheral edge of the droplet faces each channel region. Thus, the annular conductive thin film 674 is formed along the outer periphery of the second droplet (for example, the right annular conductive thin film in FIG. 24). Forming these two annular conductive thin films 674 results in the formation of the gate electrodes 674*a* to 674*d*, which are part of the conductive thin films 674. As described above, the four gate electrodes 674*a* to 674*d* with a line width on the order of submicrons included in four thin film transistors can be formed at desired positions through simple and inexpensive steps: dropping plural droplets including a conductive material while changing the drop positions by a certain amount, and drying the droplets. Four gate electrodes are formed as part of two annular conductive thin films, and therefore are electrically coupled to each other.

Thereafter, by adequately implanting self-aligned ions to serve as donors or acceptors utilizing the formed gate electrodes 674*a* to 674*d* as a mask, the source regions 675*a*, 675*c* and 675*e*, the drain regions 675*b* and 675*d*, and plural channel regions interposed between the source and drain regions are formed in the semiconductor layer (refer to FIG. 25). Through the above-described steps, it is possible to obtain a multi-channel semiconductor device including four thin film transistors coupled to each other that have gate electrodes with a gate length on the order of submicrons and a continuous shape. Although a semiconductor device including four thin film transistors has been described in the present embodiment, a semiconductor device including three or at least five thin film transistors is also available. In this case, such thin film transistors can be formed by increasing the number of deposited droplets and adjusting the arrangement of source and drain regions.

Figure 27:
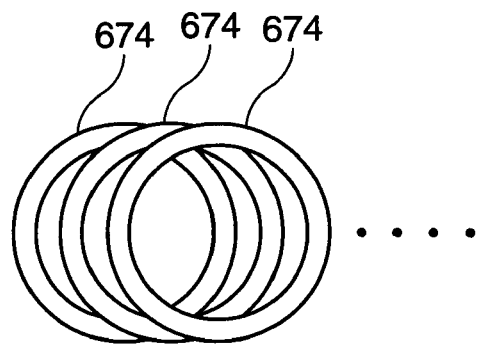
FIG. 27 is a diagram for illustrating a method for forming gate electrodes according to the eleventh illustrative embodiment.

Although the above description is made about the case in which two annular conductive thin films 674 are deposited to form four thin film transistors, the number of the annular conductive thin films 674 can be varied adequately depending on the number n (n≧2) of thin film transistors to be formed (refer to FIG. 27). Also, the deposition interval, diameter and so forth of the annular conductive thin films 674 can be varied adequately depending on, for example, design of the thin film transistors to be formed.

Twelfth Embodiment

Figure 28:
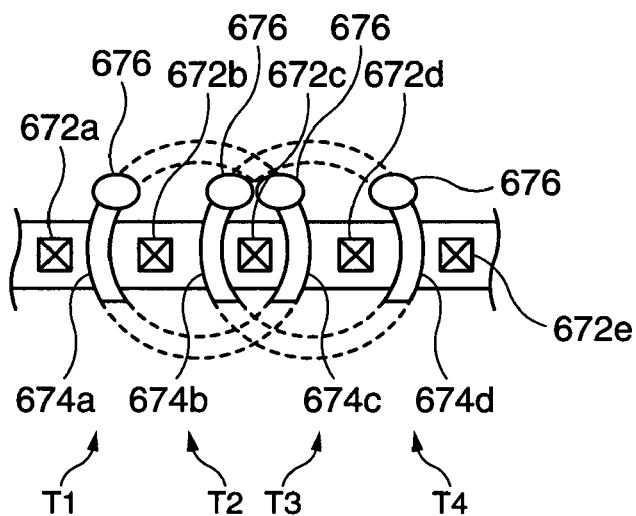
FIG. 28 is an explanatory diagram of a semiconductor device according to a twelfth illustrative embodiment of the invention.
Figure 29:
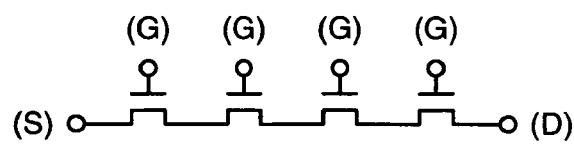
FIG. 29 is an equivalent circuit diagram of the semiconductor device according to the twelfth illustrative embodiment.
Figure 29:
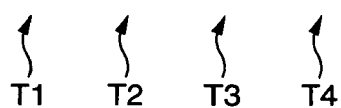

FIG. 28 illustrates a semiconductor device according to a twelfth embodiment of the invention. FIG. 29 is an equivalent circuit diagram of the semiconductor device according to the present embodiment. The semiconductor device according to the present embodiment has a structure in which thin film transistors T1 to T4 having gate electrodes with a shape of islands isolated from each other are coupled in series (refer to FIG. 29). The gate electrodes 674*a* to 674*d* included in the thin film transistors T1 to T4 are formed by removing part of two annular conductive thin films 674 shown in FIG. 24. A method for forming the gate electrodes 674*a* to 674*d* will be described below. First, as described in the eleventh embodiment, plural droplets including a conductive material are dropped to form two annular conductive thin films 674.

Then, the parts of the annular conductive thin films 674 not serving as gate electrodes (that is, parts except for those facing channel regions) are removed to obtain the gate electrodes 674*a* to 674*d*. The following methods can be used for removing the thin film: a method of supplying an acid solution such as a hydrochloric acid or sulfuric acid to remove the unnecessary conductive thin film with the acid solution, a method of lifting off a silicon oxide film with a hydrofluoric acid, or etching. The area of the regions from which conductive films are to be removed is not on the order of submicrons, and therefore etching employing a relatively inexpensive method can be used. If necessary, gate electrode pads 676 may be formed after removing unnecessary conductive thin films (refer to FIG. 28).

Although a semiconductor device including four thin film transistors has been described in the present embodiment, a semiconductor device including three or at least five thin film transistors is also available. In this case, such thin film transistors can be formed by increasing the number of deposited droplets and adjusting the arrangement of source and drain regions.

Thirteenth Embodiment

Figure 30:
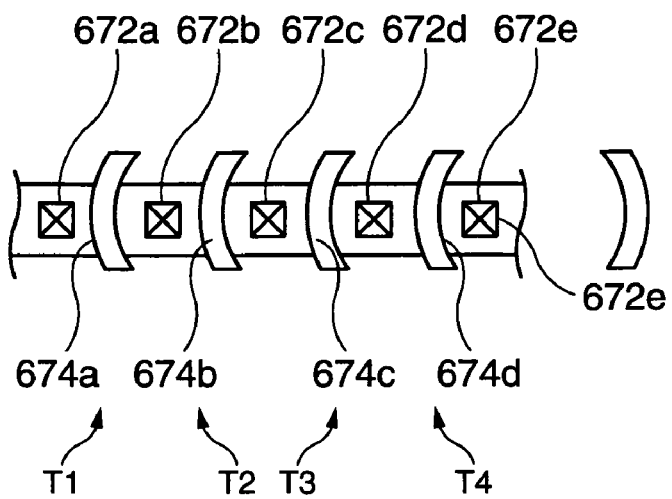
FIG. 30 is an explanatory diagram of a semiconductor device according to a thirteenth illustrative embodiment of the invention.

FIG. 30 illustrates a semiconductor device according to a thirteenth embodiment of the invention. The semiconductor device according to the present embodiment has the same circuit arrangement as that of the semiconductor device in FIG. 28. Only the method for forming gate electrodes is different from that of the semiconductor device in FIG. 28. The method for forming gate electrodes according to the present embodiment will be described below.

Figure 31A:
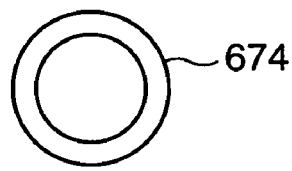
FIGS. 31A to 31C are diagrams for illustrating a method for forming gate electrodes according to the thirteenth illustrative embodiment.
Figure 31B:
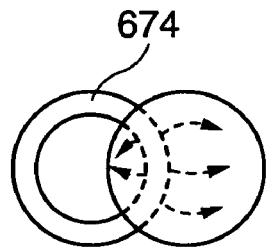
Figure 31C:
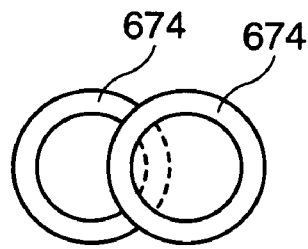

FIGS. 31A to 31C are diagrams for illustrating the method for forming gate electrodes according to the present embodiment.

First, as shown in FIG. 31A, a first droplet including a conductive material is dropped, dried, and so forth to form the annular conductive thin film 674 along the outer periphery of the first droplet. Then, a second droplet is dropped in a manner overlapping part of the annular conductive thin film 674 (refer to FIG. 31B). When dropping the second droplet, the following conditions are controlled: the dispersion medium, drying rate and contact angle of the second droplet; the particle diameter and concentration of a conductive material included in the second droplet; time interval from dropping of the first droplet to dropping of the second droplet; and so on. Thereby, part of the annular conductive thin film 674 included in the second droplet (that is, annular conductive thin film resulting from the first droplet) is redispersed or redissolved. The second droplet is dried and so forth after redispersing or redissolving the annular conductive thin film 674 included in the second droplet as describe above, and thereby the annular conductive thin film 674 is formed along the outer shape of the second droplet as shown in FIG. 31C.

The above-described sequence of steps is repeated a number of times depending on the number of gate electrodes. Subsequently, parts of the annular conductive thin films 674 not serving as gate electrodes are removed (refer to the tenth embodiment) to obtain the gate electrodes 674*a* to 674*d* shown in FIG. 30. Plural gate electrodes of thin film transistors having a line width on the order of submicrons can be formed through simple and inexpensive steps of drying deposited droplets. In the present embodiment, similarly with the tenth embodiment, conductive thin films are partially removed to form the gate electrodes 674*a* to 674*d* independent of each other. Alternatively, gate electrodes coupled to each other may be formed without removing the conductive films (refer to the eleventh embodiment).

Fourteenth Embodiment

Figure 32:
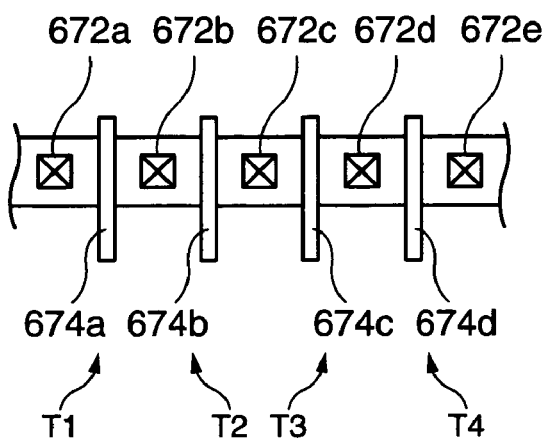
FIG. 32 is an explanatory diagram of a semiconductor device according to a fourteenth illustrative embodiment of the invention.

FIG. 32 illustrates a semiconductor device according to a fourteenth embodiment of the invention. The semiconductor device according to the present embodiment has the same circuit arrangement as that of the semiconductor device in FIG. 30. Only the shape and so forth of gate electrodes is different from that of the semiconductor device in FIG. 30. Specifically, the gate electrodes 674a to 674d in FIG. 30 have a substantially arc-like shape. In contrast, the gate electrodes 674a to 674d in FIG. 32 have a substantially linear shape. The method for forming such linear gate electrodes will be described below.

Figure 33A:
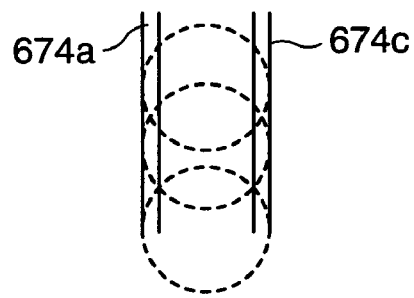
FIGS. 33A to 33C are diagrams for illustrating a method for forming gate electrodes according to the fourteenth illustrative embodiment.
Figure 33B:
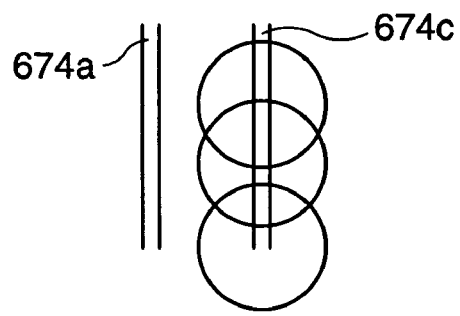
Figure 33C:
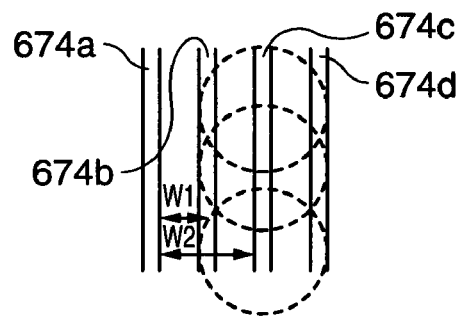

FIGS. 33A to 33C are diagrams for illustrating the method for forming gate electrodes according to the present embodiment.

In the present embodiment, droplets including a conductive material are sequentially dropped at a time interval shorter than the drying time of the droplets, for obtaining substantially linear gate electrodes (refer to FIG. 33A). Specifically, before the previously dropped droplet (for example, the uppermost droplet shown with a dashed line in FIG. 33A) has dried and therefore an annular conductive thin film has formed along the peripheral edge of the droplet, the next droplet (for example, the middle droplet shown with a dashed line in FIG. 33A) is dropped to overlap part of the previously dropped droplet. Spreading of the dropped droplets result in coalescence of the droplets. As a result, two substantially linear conductive thin films that extend along ends of the droplets are obtained as shown in FIG. 33A.

Furthermore, after two linear conductive thin films 674 (corresponding to the gate electrodes 674a and 674c shown in FIG. 33A) are formed, plural droplets are dropped similarly to form another two linear conductive thin films 674. In the present embodiment, however, since the disposing interval w1 of gate electrodes (refer to FIG. 33C) is set smaller than the interval w2 of a pair of two linear conductive thin films 674 (refer to FIG. 33C), the droplets are sequentially dropped in a manner of including part of the linear conductive thin film 674 that has been already formed (refer to FIG. 33B).

As a result, the gate electrodes 674a to 674d resulting from the formation of two pairs of two linear conductive thin films 674 are obtained as shown in FIG. 33C. According to the above-described method also, plural gate electrodes of thin film transistors having a line width on the order of submicrons can be formed through simple and inexpensive steps: dropping plural droplets including a conductive material, and drying the droplets. Although the disposing interval w1 of the gate electrodes is set smaller than the interval w2 of a pair of two linear conductive thin films 674 in the present embodiment, it will be obvious that the interval w1 of the gate electrodes may be set larger than the interval w2 of a pair of two linear conductive thin films 674.

In the above embodiments, a semiconductor region is one continuous region. Alternatively, island semiconductor regions corresponding to respective plural transistors may be formed. In this case, source and drain regions of the transistors are independent of each other, allowing more variations in arranging circuits. In addition, the source and drain regions may be disposed inversely with respect to the channel region in illustrative embodiments.

Fifteenth Embodiment

A fifteenth embodiment of the invention relates to an electro-optical device including a semiconductor device or the like that is manufactured through the method for manufacturing a thin film transistor according to illustrative embodiments of the invention. An organic electro-luminescence (EL) display will be described as one example of electro-optical devices.

Figure 34:
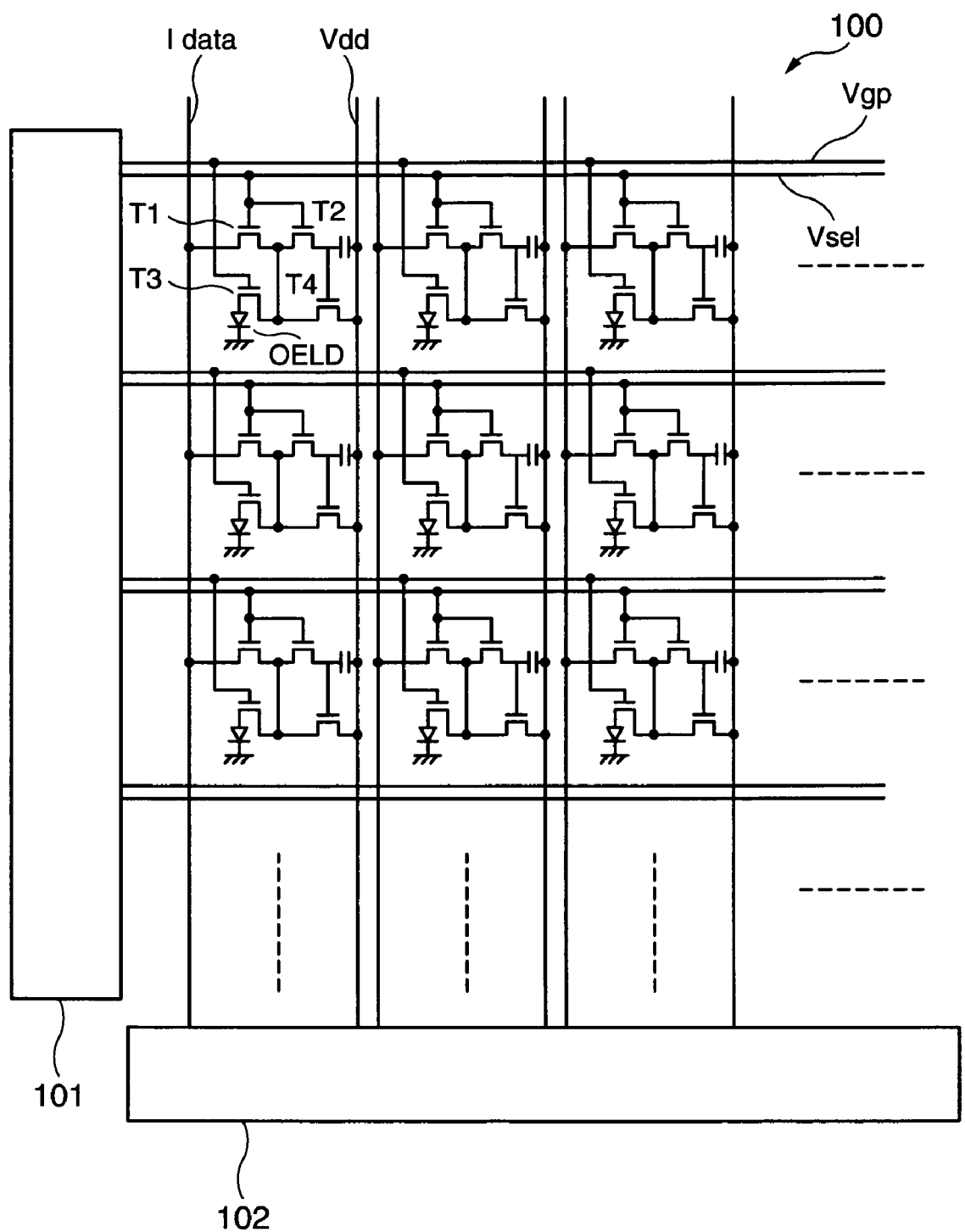
FIG. 34 is a diagram illustrating one example of a coupling state in an electro-optical device.

FIG. 34 is a diagram for illustrating the structure of an electro-optical device 100 according to the fifteenth embodiment. The electro-optical device (display device) 100 of the present embodiment includes a circuit board (active matrix substrate) having pixel driving circuits arranged in a matrix on a substrate that include thin film transistors T1 to T4, a light-emitting layer driven by the pixel driving circuit to emit light, and drivers 101 and 102 for supplying driving signals to the pixel driving circuits including the thin film transistors T1 to T4. The driver 101 supplies driving signals to pixel regions via scan lines Vsel and light-emission control lines Vgp. The driver 102 supplies driving signals to pixel regions via data lines Idata and power supply lines Vdd. Controlling the scan lines Vsel and data lines Idata leads to the execution of a current program for the pixel regions, allowing light-emission by a light-emitting OELD to be controlled. The thin film transistors T1 to T4 constituting the pixel driving circuit and the drivers 101 and 102 are formed by adopting the manufacturing method of the above-described first embodiment or second embodiment.

Although the explanation has been made about an organic EL display as one example of electro-optical devices, other various electro-optical devices such as a liquid crystal display can also be manufactured in the same manner.

Figure 35A:
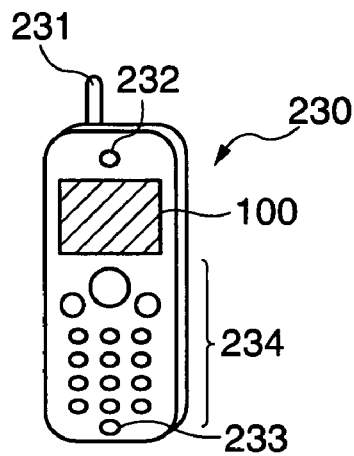
FIGS. 35A to 35D are explanatory diagrams of various electronic apparatuses to which an electro-optical device may be applied.
Figure 35B:
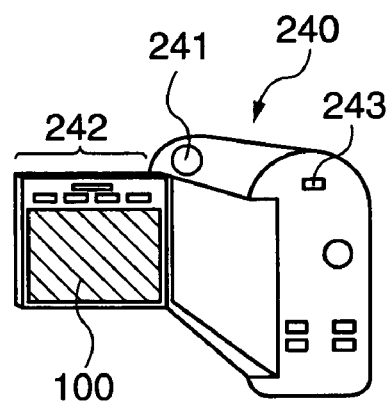
Figure 35C:
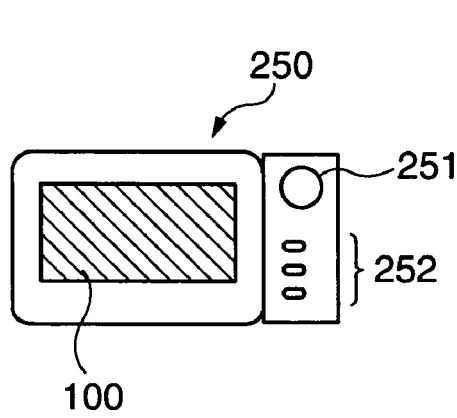

Various electronic apparatuses to which the electro-optical device 100 according to illustrative embodiments of the invention may be applied will be described. FIGS. 35A to 35D are diagrams illustrating examples of electronic apparatuses to which the electro-optical device 100 can be applied. FIG. 35A illustrates an example of application to a cellular phone. A cellular phone 230 includes an antenna 231, a sound output part 232, a sound input part 233, an operation unit 234 and the electro-optical device 100 of illustrative embodiments of the invention. The electro-optical device according to illustrative embodiments of the invention can be used as a display as above. FIG. 35B illustrates an example of application to a video camera. A video camera 240 includes a picture receiver 241, an operation unit 242, a sound input part 243 and the electro-optical device 100 of illustrative embodiments of the invention. The electro-optical device according to illustrative embodiments of the invention can be used as a finder or display as above. FIG. 35C illustrates an example of application to a portable personal computer (so-called PDA). A computer 250 includes a camera unit 251, an operation unit 252, and the electro-optical device 100 of illustrative embodiments of the invention. The electro-optical device according to illustrative embodiments of the invention can be used as a display as above.

Figure 35D:
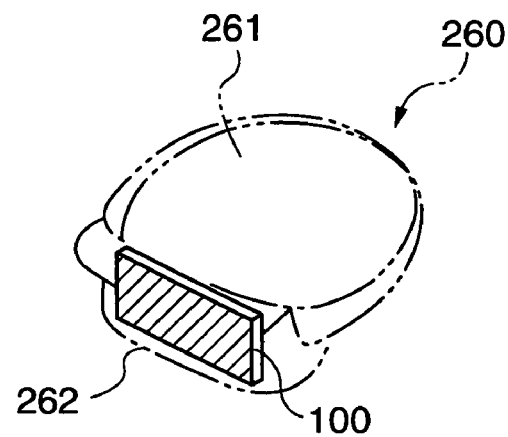

FIG. 35D illustrates an example of application to a head mount display. A head mount display 260 includes a band 261, a housing unit 262 for an optical system, and the electro-optical device 100 of illustrative embodiments of the invention. The electro-optical device according to illustrative embodiments of the invention can be used as an image display source as above. Electronic apparatuses that can include the electro-optical device 100 according to illustrative embodiments of the invention are not limited to the above-described examples. The electro-optical device 100 can be applied to any electronic apparatus that can include a display such as an organic EL display or liquid crystal display. For example, the electro-optical device 100 can be utilized for, in addition to the above examples, a facsimile device with a display function, a finder of a digital camera, a portable TV, an electronic notebook, an electronic signboard, an advertisement display, or the like.

Figure 36A:
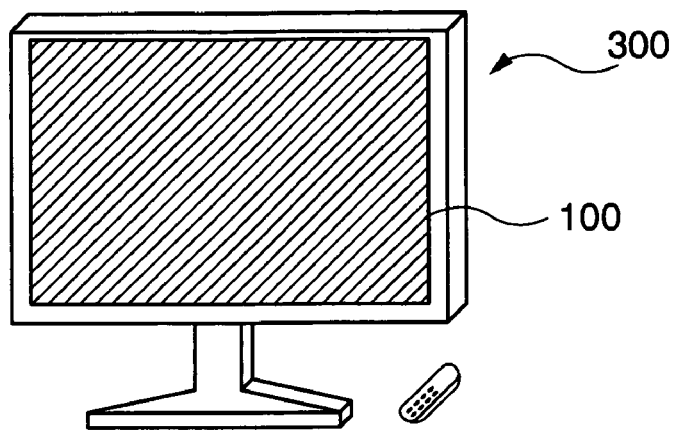
FIGS. 36A and 36B are explanatory diagrams of various electronic apparatuses to which an electro-optical device may be applied.
Figure 36B:
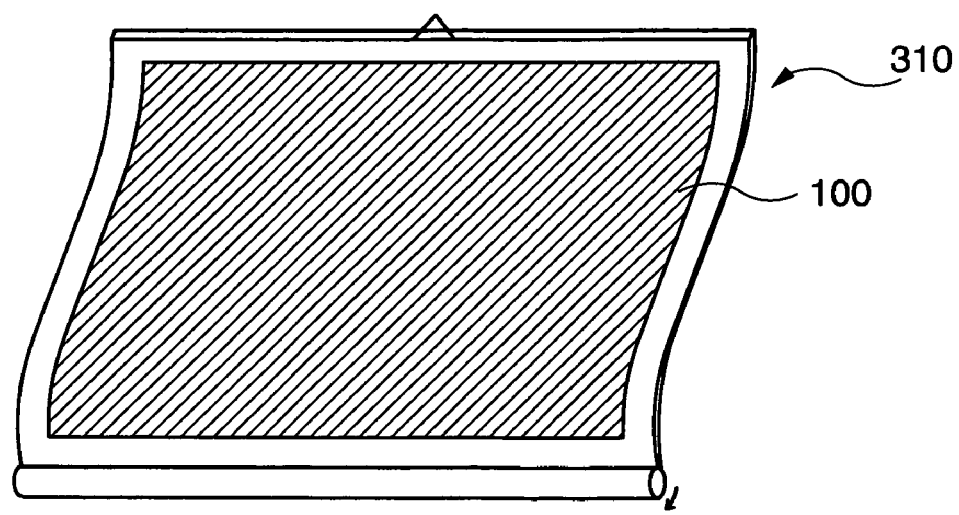

FIG. 36A illustrates an example of application to a television. A television 300 includes the electro-optical device 100 according to illustrative embodiments of the invention. Similarly, the electro-optical device according to illustrative embodiments of the invention can also be applied to a monitor used for a personal computer or the like. FIG. 36B illustrates an example of application to a roll-up television. A roll-up television 310 includes the electro-optical device 100 according to illustrative embodiments of the invention.

The manufacturing method according to the above-described embodiments can be applied to the manufacturing of various devices as well as electro-optical devices. For example, various memories such as a ferroelectric RAM (FeRAM), SRAM, DRAM, NOR RAM, NAND RAM, floating gate non-volatile memory, and magnetic RAM (MRAM) can be manufactured. In addition, the manufacturing method according to illustrative embodiments of the invention can be applied to the manufacturing of inexpensive tags including small circuit chips (IC chips) used in a non-contact communication system employing micro waves.

It should be noted that the invention is not limited to the above-described embodiments, and various changes and modifications can be made within the gist of the invention. For example, a semiconductor film is not limited to the described embodiments, in which a silicon film is adopted as one example of semiconductor films. Furthermore, a semiconductor element is not limited to the described embodiments, in which thin film transistors are adopted as one example of semiconductor elements that are formed using the semiconductor film according to the illustrative embodiments of the invention. Other elements (for example, thin film diodes or the like) may be formed. The thin film transistor of the illustrative embodiments of the invention may also be used as, in addition to a pixel transistor, a transistor in an integrated circuit.

What is claimed is:

1. A method of manufacturing a semiconductor device, comprising:
   forming an annular semiconductor film by evaporating a droplet, the droplet including a semiconductor material; and
   forming a line-shaped semiconductor film by removing a part of the annular semiconductor film.

2. The method according to claim 1, further comprising:
   forming a gate insulating film over the line-shaped semiconductor; and
   forming a gate electrode over the gate insulating film.

3. The method according to claim 1, further comprising:
   forming a gate insulating film over the line-shaped semiconductor;
   forming an annular conductive film over the gate insulating film; and
   forming a line-shaped conductive film by removing a part of the annular conductive film, the line-shaped conductive film being configured to be used as a gate electrode.

4. The method according to claim 1, the droplet being disposed over a substrate prior to the evaporating, further comprising:
   adjusting a temperature of the substrate prior to the disposing of the droplet over the substrate.

5. The method according to claim 1, further comprising:
   controlling a vaporization condition of the droplet prior to the disposing of the droplet over the substrate.

6. The method according to claim 1, further comprising:
   controlling a viscosity of the droplet prior to the disposing of the droplet over the substrate.

7. A method of manufacturing a semiconductor device, comprising:
   forming an annular conductive film by evaporating a droplet, the droplet including a conductive material; and
   forming a line-shaped conductive film by removing a part of the annular conductive film.

8. The method according to claim 1, further comprising:
   forming a semiconductor film prior to the forming of the annular conductive film; and
   forming a gate insulating film over the semiconductor film prior to the forming of the annular conductive film, the line-shaped conductive film being configured to be used as a gate electrode.

9. The method according to claim 1, further comprising:
   forming a semiconductor film prior to the forming of the annular conductive film; and
   forming a gate insulating film next to the annular conductive film, the line-shaped conductive film being configured to be used as a part of one of source and drain electrodes.

10. The method according to claim 7, the droplet being disposed over a substrate prior to the evaporating, further comprising:
    adjusting a temperature of the substrate prior to the disposing of the droplet over the substrate.

11. The method according to claim 7, further comprising:
    controlling a vaporization condition of the droplet prior to the disposing of the droplet over the substrate.

12. The method according to claim 7, further comprising:
    controlling a viscosity of the droplet prior to the disposing of the droplet over the substrate.

13. The method of manufacturing a semiconductor device, comprising:
    forming an annular semiconductor film by evaporating a droplet, the droplet including a semiconductor material;
    forming a gate insulating film over the annular semiconductor film; and
    forming a gate electrode over the gate insulating film.

14. A method of manufacturing a semiconductor device, comprising:
    forming a semiconductor film;
    forming a gate insulating film over the semiconductor film; and
    forming an annular conductive film by evaporating a droplet, the droplet including a conductive material, the annular conductive film being configured to be used as a gate electrode.

15. A method of manufacturing an electro-optical device having the semiconductor device manufactured according to claim 1.

16. A method of manufacturing an electro-optical device having the semiconductor device manufactured according to claim 7.

17. A method of manufacturing an electronic device having the electro-optical device manufactured according to claim 15.

18. A method of manufacturing an electronic device having the electro-optical device manufactured according to claim 16.

* * * * *